(12) United States Patent
Terao et al.

(10) Patent No.: US 12,130,096 B2
(45) Date of Patent: Oct. 29, 2024

(54) HEAT SINK, SEMICONDUCTOR PACKAGE AND SEMICONDUCTOR MODULE

(71) Applicants: JFE PRECISION CORPORATION, Niigata (JP); JFE STEEL CORPORATION, Tokyo (JP)

(72) Inventors: Hoshiaki Terao, Niigata (JP); Kouichi Hashimoto, Niigata (JP); Raita Wada, Niigata (JP)

(73) Assignees: JFE PRECISION CORPORATION, Niigata (JP); JFE STEEL CORPORATION, Tokyo (JP)

( * ) Notice: Subject to any disclaimer, the term of this patent is extended or adjusted under 35 U.S.C. 154(b) by 292 days.

(21) Appl. No.: 17/753,215

(22) PCT Filed: Aug. 28, 2020

(86) PCT No.: PCT/JP2020/032773
§ 371 (c)(1),
(2) Date: Feb. 24, 2022

(87) PCT Pub. No.: WO2021/040030
PCT Pub. Date: Mar. 4, 2021

(65) Prior Publication Data
US 2022/0299278 A1 Sep. 22, 2022

(30) Foreign Application Priority Data
Aug. 29, 2019 (JP) .................................. 2019-156961

(51) Int. Cl.
*F28F 21/08* (2006.01)
*H01L 23/00* (2006.01)
(Continued)

(52) U.S. Cl.
CPC ........ *F28F 21/089* (2013.01); *H01L 23/3735* (2013.01); *H01L 24/32* (2013.01);
(Continued)

(58) Field of Classification Search
CPC .... F28F 21/089; F28F 2245/00; F28F 21/085; H01L 23/3735; H01L 24/32; H01L 24/48;
(Continued)

(56) References Cited

U.S. PATENT DOCUMENTS

2002/0191377 A1* 12/2002 Osada .................... C22C 27/04
257/E23.185
2009/0258248 A1* 10/2009 Tsushima .............. B32B 15/018
428/656
(Continued)

FOREIGN PATENT DOCUMENTS

JP  2001358266 A  12/2001
JP  2007142126 A  6/2007
(Continued)

OTHER PUBLICATIONS

Oct. 13, 2020, International Search Report issued in the International Patent Application No. PCT/JP2020/032773.

*Primary Examiner* — Patricia D Valenzuela
(74) *Attorney, Agent, or Firm* — KENJA IP LAW PC

(57) ABSTRACT

Provided is a heat sink having a clad structure of Co—Mo composite materials and Cu materials, satisfying high heat-sink properties required of the heat sink for use in a semiconductor package with a frame on which a high-output and small-sized semiconductor is mounted, and preventing, when applied to the semiconductor package with a frame, crack of the frame due to local stress concentration. The heat sink has three or more Cu layers and two or more Cu—Mo composite layers alternately stacked in a thickness direction so that the Cu layers are outermost layers on both sides thereof, the Cu layers as the outermost layers each having a thickness $t_1$ of 40 μm or more, the heat sink satisfying $0.06 \leq t_1/T \leq 0.27$ (where T: heat sink thickness) and $t_2/T \leq 0.36/[(\text{total number of layers}-1)/2]$ (where $t_2$: Cu—Mo
(Continued)

composite layer thickness, the total number of layers: sum of numbers of Cu layers and Cu—Mo composite layers).

11 Claims, 9 Drawing Sheets

(51) Int. Cl.
*H01L 23/373* (2006.01)
*B32B 15/01* (2006.01)
*H01L 25/16* (2023.01)

(52) U.S. Cl.
CPC ......... *B32B 15/018* (2013.01); *F28F 2245/00* (2013.01); *H01L 24/48* (2013.01); *H01L 24/49* (2013.01); *H01L 24/73* (2013.01); *H01L 25/16* (2013.01); *H01L 2224/32245* (2013.01); *H01L 2224/48155* (2013.01); *H01L 2224/48195* (2013.01); *H01L 2224/48247* (2013.01); *H01L 2224/49175* (2013.01); *H01L 2224/73265* (2013.01); *H01L 2924/0002* (2013.01); *H01L 2924/01042* (2013.01); *H01L 2924/1517* (2013.01); *H01L 2924/15747* (2013.01); *H01L 2924/15763* (2013.01)

(58) Field of Classification Search
CPC ......... H01L 24/49; H01L 24/73; H01L 25/16; H01L 2224/32245; H01L 2224/48155; H01L 2224/48195; H01L 2224/48247; H01L 2224/49175; H01L 2224/73265; H01L 2924/01042; H01L 2924/1517; H01L 2924/15747; H01L 2924/15763; H01L 24/29; H01L 24/83; H01L 2224/29101; H01L 23/3736; H01L 2224/83801; H01L 2924/00014; H01L 2924/19105; H01L 23/047; H01L 23/10; H01L 23/367; F28D 2021/0029; B21B 1/38; B21B 3/00; B32B 15/01; B32B 15/20; C22C 27/04; H05K 7/20

See application file for complete search history.

(56) References Cited

U.S. PATENT DOCUMENTS

| | | | |
|---|---|---|---|
| 2020/0051889 | A1 | 2/2020 | Terao et al. |
| 2020/0395268 | A1 | 12/2020 | Terao et al. |

FOREIGN PATENT DOCUMENTS

| | | |
|---|---|---|
| JP | 6455896 B1 | 1/2019 |
| JP | 2019096860 A | 6/2019 |
| WO | 2018043179 A1 | 3/2018 |
| WO | 2019098350 A1 | 5/2019 |

\* cited by examiner

HEAT SINK, SEMICONDUCTOR PACKAGE AND SEMICONDUCTOR MODULE

TECHNICAL FIELD

The present disclosure relates to a heat sink used to efficiently dissipate heat generated from a heat generator such as a semiconductor element, in particular a heat sink suitable for a semiconductor package of a type in which a high-output and small-sized semiconductor is directly bonded to the heat sink.

BACKGROUND

A heat sink is used to efficiently dissipate heat generated from a semiconductor element, from the semiconductor device. The heat sink is required to have high thermal (heat) conductivity for its function. Moreover, since the heat sink is bonded to a semiconductor, a ceramic circuit substrate, a metal package member, or the like by soldering or brazing, the heat sink is required to have a coefficient of thermal (heat) expansion (low coefficient of thermal expansion) close to that of the member to which the heat sink is bonded.

There is a type of semiconductor package in which a semiconductor is bonded directly to the heat sink. In general, this semiconductor package has a structure in which a ceramic frame, which serves as a part of the case (sealing member) to hold a semiconductor and as an insulating member for electrodes, is bonded (brazed) to a heat sink, and the semiconductor is bonded (soldered) to the heat sink inside the frame. A semiconductor package with a frame made of a metal with a low coefficient of thermal expansion such as Kovar, instead of ceramic, is also used.

In recent years, this type of semiconductor package (hereinafter referred to as "semiconductor package with a frame" for convenience of explanation) has been mounted with a small-sized (small area) and high-output semiconductor and used for mobile base stations. However, for mobile base stations for 5G to be installed in the future, semiconductors are expected to have higher output and a smaller size, and as a result, heat sinks to be used for such semiconductors will be required to have higher heat-sink properties.

A Mo—Cu composite material has been conventionally used as a heat sink having high thermal conductivity and a low coefficient of thermal expansion. Typically, a Mo—Cu composite material used in a heat sink is manufactured by pressing a Mo powder or a mixed powder of a Mo powder and a Cu powder to obtain a green compact, optionally reducing sintering the green compact, and then subjecting it to Cu infiltration or densification to obtain a Mo—Cu composite material and rolling the Mo—Cu composite material. Mo hardly dissolves with Cu, so that the Mo—Cu composite material has a dual phase structure of Mo and Cu. A heat sink taking advantage of the property of Mo having a low coefficient of thermal expansion and the property of Cu having high thermal conductivity can thus be yielded.

JP 2001-358266 A (PTL 1) discloses, as a heat sink based on such a Mo—Cu composite material, a heat sink obtained by pressure joining Cu sheets to both sides of a Mo—Cu composite material yielded through a specific rolling process, i.e., a heat sink with a three-layer clad structure of Cu/(Cu—Mo)/Cu (hereinafter referred to as "Conventional Technique 1"). According to PTL 1, this heat sink has higher thermal conductivity than a Mo—Cu composite material alone and also has excellent press blanking workability.

However, because the heat sink of Conventional Technique 1 has low thermal conductivity in the thickness direction, and thus cannot achieve high thermal conductivity, it cannot satisfy high heat-sink properties required of the heat sink for use in a semiconductor package with a frame as described above.

In contrast, PTL 2 (JP 6455896 B) describes a heat sink having five or more stacked layers of Mo—Cu composite materials and Cu materials, i.e., a five-layer clad structure of Cu/(Cu—Mo)/Cu/(Cu—Mo)/Cu or a seven-layer clad structure of Cu/(Cu Mo)/Cu/(Cu—Mo)/Cu/(Cu—Mo)/Cu (hereinafter referred to as "Conventional Technique 2"). In this heat sink, the Cu layers as the outermost layers (hereinafter referred to as the "outermost Cu layer") can be relatively thinner than that of the heat sink of Conventional Technique 1 having the same thickness and density, so that the thermal conductivity in the thickness direction can be made higher than that of the heat sink of Conventional Technique 1. The heat sink specifically disclosed in Conventional Technique 2 has outermost Cu layer thickness/heat sink thickness≤0.2, and when the outermost Cu layer thickness/heat sink thickness is smaller, the thermal conductivity in the thickness direction is higher.

CITATION LIST

Patent Literature

PTL 1: JP 2001-358266 A
PTL 2: JP 6455896 B

SUMMARY

Technical Problem

The heat sink of Conventional Technique 2 has high heat-sink properties. However, we have examined the heat sink of Conventional Technique 2 and found that when applying the heat sink of Conventional Technique 2 to a semiconductor package with a frame in which a high-output and small-sized semiconductor is directly bonded to the heat sink (hereinafter, when simply referring to a semiconductor package with a frame, the term "semiconductor package with a frame" also refers to a semiconductor package with a frame of this type), there is room for further improvement, as follows.

In detail, among the heat sinks of Conventional Technique 2, a heat sink in which the outermost Cu layer thickness/heat sink thickness is relatively small can obtain a high thermal conductivity in the thickness direction, but at the same time, when a semiconductor is bonded (soldered) to the heat sink, if local stress is excessively concentrated on the ceramic frame constituting the semiconductor package (hereinafter also referred to as the "ceramic frame"), the ceramic frame may crack. On the other hand, when a heat sink in which the outermost Cu layer thickness/heat sink thickness is relatively large, the ceramic frame is less likely to crack as described above, but there is room for improvement in heat-sink properties. Furthermore, when the outermost Cu layer thickness/heat sink thickness is relatively small, the temperature at the early stage of semiconductor start-up may become relatively high and when the outermost Cu layer thickness/heat sink thickness is relatively large, the temperature during steady-state operation of the semiconductor may become relatively high. Thus, there is room for improvement in the durability and reliability of the semiconductor package with a frame on which a high-output and small-sized semiconductor is mounted.

It could thus be helpful to provide a heat sink capable of satisfying the high heat-sink properties required of a heat sink for use in a semiconductor package with a frame on which a high-output and small-sized semiconductor is mounted, and at the same time preventing crack of the frame (such as a ceramic frame) constituting the package due to local stress concentration when the heat sink is applied to the semiconductor package with a frame.

It could also be helpful to provide a semiconductor package provided with such a heat sink having excellent thermal properties.

Solution to Problem

We have conducted a detailed study of the technical issues and the means for solving them when the heat sink of Conventional Technique 2 is applied to a semiconductor package with a frame on which a high-output and small-sized semiconductor is mounted, and as a result, we have obtained the following discoveries.

The heat sink of Conventional Technique 2 is particularly designed to keep the coefficient of thermal expansion as low as possible while ensuring a high thermal conductivity of 200 W/m·K or more, and for this purpose, the specifically disclosed heat sink is designed to have a relatively thin outermost Cu layer (outermost Cu layer thickness/heat sink thickness≤0.2) and a relatively thick Cu—Mo composite layer (Cu—Mo composite layer/heat sink thickness ≥0.2 in some cases). In the heat sink of the Conventional Technique 2, while the thermal conductivity in the thickness direction increases as the outermost Cu layer thickness/heat sink thickness decreases, when the heat sink with a relatively small outermost Cu layer thickness/heat sink thickness is applied to a semiconductor package with a frame, the ceramic frame may crack when excessive stress is concentrated locally on the ceramic frame.

On the other hand, while when the heat sink with a relatively large outermost Cu layer thickness/heat sink thickness is used, the ceramic frame is less likely to crack as described above, the ratio of each Cu—Mo composite layer to the heat sink thickness is as high as 0.2 or more (Cu—Mo composite layer thickness/heat sink thickness ≥0.2), so there is room for improvement in its heat-sink properties as in (a) to (c) below. As described above, in the semiconductor package with a frame in which a high-output and small-sized semiconductor is directly bonded to the heat sink, it is particularly important to dissipate heat efficiently, and therefore the heat sink used must have high heat-sink properties. We considered that by addressing (a) to (c) below, higher heat-sink properties can be satisfied and the durability of the semiconductor package with a frame can be improved.

(a) Since high heat-sink properties are required of a heat sink for use in a semiconductor package with a frame, it is desirable that the thermal conductivity in the thickness direction of the heat sink be as high as possible. However, in Conventional Technique 2, the heat sink with relatively large outermost Cu layer thickness/heat sink thickness has lower thermal conductivity in the thickness direction than the heat sink with relatively small outermost Cu layer thickness/heat sink thickness.

(b) In a semiconductor package with a frame in which a high-output and small-sized semiconductor is directly bonded to a heat sink, heat is efficiently dissipated by allowing heat to dissipate in the thickness direction while allowing heat to escape in the in-plane direction of the heat sink. For this reason, for the properties of the heat sink used for the semiconductor package with a frame, it is important to be able to dissipate the heat of the semiconductor in a well-balanced manner in the thickness direction and the in-plane direction, specifically, to have a high ratio (%) of the thermal conductivity in the thickness direction to the thermal conductivity in the in-plane direction. Here, in order to facilitate the escape of heat in the thickness direction of the heat sink, it is important to minimize the heat flow loss in the thickness direction due to the interface thermal resistance between the outermost Cu layer and the Cu—Mo composite layer. It was found that the interface thermal resistance between the layers also depends on the thickness of the Cu—Mo composite layer, and the interface thermal resistance between the layers becomes larger as the thickness of the Cu—Mo composite layer is larger. In this regard, in the heat sink of Conventional Technique 2, since the ratio of the Cu—Mo composite layer to the heat sink thickness is relatively high, the heat flow loss in the thickness direction due to the interface thermal resistance between the layers increases, and heat is difficult to escape in the thickness direction. Therefore, the ratio (%) of the thermal conductivity in the thickness direction to the thermal conductivity in the in-plane direction is low, and the heat of the semiconductor cannot dissipate in a well-balanced manner in the thickness direction and in the in-plane direction.

(c) As the ratio (%) of the thermal conductivity in the thickness direction (measured value) to the thermal conductivity in the thickness direction (calculated value) calculated according to the simple rule of mixture is higher, the heat flow loss in the thickness direction due to interface thermal resistance between the layers, etc. decreases and thus a desired high thermal conductivity can be stably obtained. This is an important property for efficient heat dissipation in a semiconductor package with a frame in which a high-output and small-sized semiconductor is directly bonded to the heat sink. However, in the heat sink of Conventional Technique 2, since the ratio of the Cu—Mo composite layer to the heat sink thickness is relatively high, the heat flow loss in the thickness direction due to the interface thermal resistance between the layers increases, and the measured value/calculated value of the thermal conductivity in the thickness direction is difficult to be high.

In addition, when the heat sink of Conventional Technique 2 is applied to a semiconductor package with a frame in which a high-output and small-sized semiconductor is directly bonded to the heat sink, we have found that there is room for improvement in terms of semiconductor temperature as follows.

In detail, among the heat sinks of Conventional Technique 2, a heat sink with a relatively small outermost Cu layer thickness/heat sink thickness have a high thermal conductivity in the thickness direction, but there is room for improvement in the spread of heat (heat dissipation) in the in-plane direction through the outermost Cu layer. A high-output and small-sized semiconductor generates a large amount of heat per unit area, and a large amount of heat is applied to a small area where the semiconductor and the heat sink come into contact. Therefore, in the early stage of semiconductor start-up, there is a risk that the temperature will increase rapidly. On the other hand, if the outermost Cu layer thickness/heat sink thickness is relatively large, heat spreads in the in-plane direction (heat dissipation) through the outermost Cu layer, so that the temperature does not rise sharply in the early stage of semiconductor start-up, but on the other hand, as mentioned above, it is difficult to stably obtain high thermal conductivity. There is also room for improvement in the heat dissipation balance in the thickness and in-plane directions. As a result, the temperature level during steady-state operation of the semiconductor tends to be high, and thus there is room for improvement in thermal conductivity. For this reason, there is room for improvement in the durability and reliability of the semiconductor package when the heat sink of Conventional Technique 2 is applied to a semiconductor package with a frame in which a high-output and small-sized semiconductor is directly bonded to the heat sink.

Based on the above findings, we have studied the configuration of a heat sink that can solve the above problem when the heat sink is applied to a semiconductor package with a frame in which a high-output and small-sized semiconductor is directly bonded to the heat sink. As a result, we have found that in a heat sink having three or more Cu layers and two or more Cu—Mo composite layers alternately stacked so that the two of the Cu layers are outermost layers on both sides thereof, the above problem can be solved by optimizing the thickness of each of the outermost Cu layers, the thickness ratio of each of the outermost Cu layers to the heat sink thickness, and the thickness ratio of each of the Cu—Mo composite layers to the heat sink thickness, and in particular, in relation to the Conventional Technique 2, by reducing the ratio of the thickness of each of the Cu—Mo composite layers to the heat sink thickness.

The present disclosure is based on the above findings and the primary features thereof are as described below.

[1] A heat sink comprising three or more Cu layers and two or more Cu—Mo composite layers alternately stacked in a thickness direction so that the two of the Cu layers are outermost layers on both sides thereof, wherein
    the Cu—Mo composite layers each have a thickness section microstructure in which a flat Mo phase is dispersed in a Cu matrix,
    the Cu layers as the outermost layers on both sides each have a thickness $t_1$ of 40 μm or more,
    the heat sink satisfies $0.06 \leq t_1/T \leq 0.27$, where T denotes a heat sink thickness, and $t_2/T \leq 0.36/[(\text{total number of layers}-1)/2]$, where $t_2$ denotes a thickness of each of the Cu—Mo composite layers and the total number of layers is a sum of the number of the Cu layers and the number of the Cu—Mo composite layers.

[2] The heat sink according to [1], which satisfies $t_2/T \leq 0.30/[(\text{total number of layers}-1)/2]$, where the total number of layers is a sum of the number of the Cu layers and the number of the Cu—Mo composite layers.

[3] The heat sink according to [1] or [2], which satisfies $0.10 \leq t_1/T \leq 0.27$.

[4] The heat sink of according to [1] or [2], which satisfies $0.10 \leq t_1/T \leq 0.20$.

[5] The heat sink according to any of [1] to [4], the Cu—Mo composite layers each have a Mo content of 50 mass % or more and 80 mass % or less.

[6] The heat sink according to any of [1] to [5], wherein the Cu—Mo composite layers each have a structure in which a plurality of unit Cu—Mo composite layers are stacked with a Cu layer for bonding having a thickness of 75 μm or less being interposed therebetween.

[7] The heat sink according to any of [1] to [6], comprising a thermal conductivity in the thickness direction of 250 W/m·K or more, and an average coefficient of thermal expansion in an in-plane direction from 50° C. to 800° C. of 10.0 ppm/K or less.

[8] The heat sink according to any of [1] to [7], comprising a coating or plating on one or both sides thereof.

[9] The heat sink according to any of [1] to [8], which is used for a semiconductor package having a structure in which a frame made of ceramic or metal with a low coefficient of thermal expansion is bonded to the heat sink and a semiconductor is bonded to the heat sink inside the frame.

[10] A semiconductor package comprising the heat sink according to any of [1] to [9].

[11] The semiconductor package according to [10], comprising a structure in which a frame made of ceramic or metal with a low coefficient of thermal expansion is bonded to the heat sink and a semiconductor is bonded to the heat sink inside the frame.

[12] A semiconductor module comprising the semiconductor package according to or [11].

[13] A semiconductor package comprising a heat sink having three or more Cu layers and two or more Cu—Mo composite layers alternately stacked in a thickness direction so that the two of the Cu layers are outermost layers on both sides thereof, wherein
    the Cu—Mo composite layers each have a thickness section microstructure in which a flat Mo phase is dispersed in a Cu matrix,
    the Cu layers as the outermost layers on both sides each have a thickness $t_1$ of 40 μm or more,
    the heat sink satisfies $0.06 \leq t_1/T \leq 0.27$, where T denotes a heat sink thickness, and $t_2/T \leq 0.36/[(\text{total number of layers}-1)/2]$, where $t_2$ denotes a thickness of each of the Cu—Mo composite layers and the total number of layers is a sum of the number of the Cu layers and the number of the Cu—Mo composite layers,
    the semiconductor package having a structure in which a frame made of ceramic or metal having a low coefficient of thermal expansion is bonded to the heat sink, and a semiconductor is bonded to the heat sink inside the frame.

[14] The semiconductor package according to [13], wherein the heat sink satisfies $t_2/T \leq 0.30/[(\text{total number of layers}-1)/2]$, where the total number of layers is a sum of the number of the Cu layers and the number of the Cu—Mo composite layers.

[15] The semiconductor package according to or [14], wherein the heat sink satisfies $0.10 \leq t_1/T \leq 0.27$.

[16] The semiconductor package according to or [14], wherein the heat sink satisfies $0.10 \leq t_1/T \leq 0.20$.

[17] The semiconductor package according to any of to [16], wherein the Cu—Mo composite layers of the heat sink each have a Mo content of 50 mass % or more and 80 mass % or less.

[18] The semiconductor package according to any of to [17], wherein the Cu—Mo composite layers of the heat sink each have a structure in which a plurality of unit Cu—Mo composite layers are stacked with a Cu layer for bonding having a thickness of 75 μm or less being interposed therebetween.

[19] The semiconductor package according to any of to [18], wherein the heat sink has a thermal conductivity in the thickness direction of 250 W/m·K or more, and an average coefficient of thermal expansion in an in-plane direction from 50° C. to 800° C. of 10.0 ppm/K or less.

[20] The semiconductor package according to any of to [19], wherein the heat sink composed of the stacked Cu layers and Cu—Mo composite layers has a coating or plating on one or both sides thereof.

[21] A semiconductor module comprising the semiconductor package according to any of to [20].

Advantageous Effect

The present disclosure can provide a heat sink having excellent thermal properties such as a low coefficient of thermal expansion and high thermal conductivity, in particular, a heat sink capable of satisfying the high heat-sink properties required of a heat sink for use in a semiconductor package with a frame on which a high-output and small-sized semiconductor is mounted, and at the same time, when the heat sink is applied to the semiconductor package with a frame, preventing crack of the frame (such as a ceramic frame) constituting the package due to local stress concentration.

Also, the present disclosure also provides a semiconductor package having an excellent heat dissipation property in which heat of a semiconductor efficiently dissipates, in particular, in the case of having a frame, which appropriately prevents crack due to local stress concentration of the frame (such as a ceramic frame) constituting the package to provide high durability.

DETAILED DESCRIPTION

The following describes one of the disclosed embodiments. The present disclosure is not limited to the following embodiment. In the present specification, a numerical range expressed by using "to" means a range including numerical values described before and after "to", as the lower limit value and the upper limit value.

The semiconductor package of the present embodiment comprises a heat sink having three or more Cu layers and two or more Cu—Mo composite layers alternately stacked in a thickness direction so that two of the Cu layers are outermost layers on both sides thereof, the Cu—Mo composite layers each having a thickness section microstructure in which a flat Mo phase is dispersed in a Cu matrix.

Figure 1A:
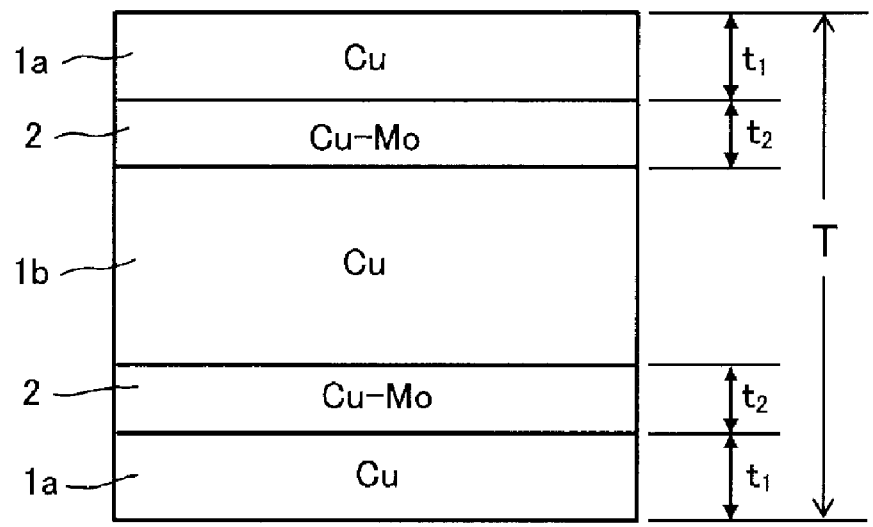
FIG. 1A is an explanatory diagram schematically illustrating a cross section along the sheet thickness direction of a heat sink having a five-layer clad structure.
Figure 1B:
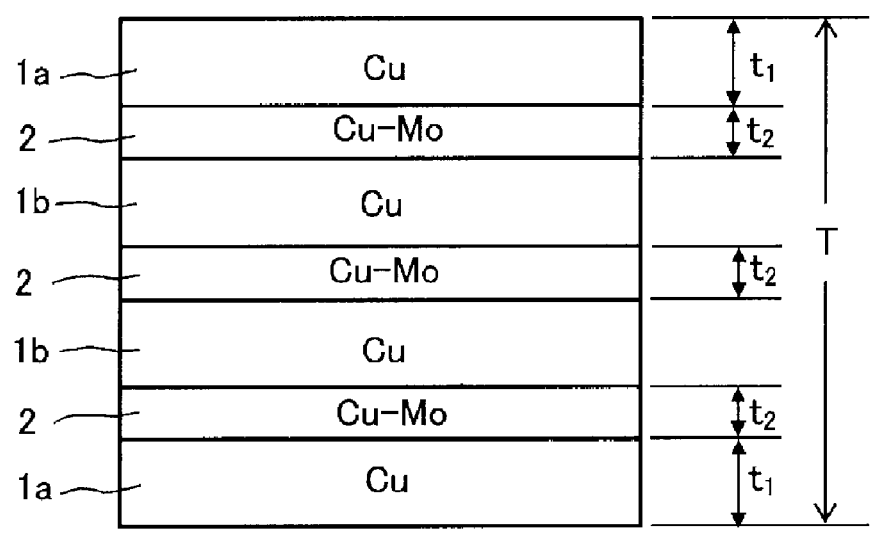
FIG. 1B is an explanatory diagram schematically illustrating a cross section along the sheet thickness of a heat sink having a seven-layer clad structure.

In the heat sink of the present embodiment, there is no restriction on the stacked number (the sum of the number of the Cu layers and the Cu—Mo composite layers) of the clad structure, and five, seven, nine, or even eleven or more layers may be stacked. FIG. 1A schematically illustrates a cross section along the sheet thickness direction of a heat sink having a five-layer clad structure of the present embodiment and FIG. 1B schematically illustrates a cross section along the sheet thickness direction of a heat sink having a seven-layer clad structure of the present embodiment. In FIGS. 1A and 1B, reference sign $1a$ indicates the Cu layer as an outermost layer provided on each side, and reference sign $1b$ indicates the Cu layer as an intermediate layer, and reference sign 2 indicates the Cu—Mo composite layer.

The Cu—Mo composite layer and Cu layer in the heat sink of the present embodiment are formed by diffusion bonding the stacked Cu—Mo composite material and Cu material, and have a diffusion bonded part therebetween. This diffusion bonded part is a sound diffusion bonded part because Cu (Cu in the Cu—Mo composite material and the Cu material) of both members are diffusion bonded. For example, in the case of cladding Mo (Mo material) and Cu (Cu material), both members are bonded not by diffusion bonding but by mechanical bonding because Mo and Cu are not alloyed. With such bonding, an oxide film or fine voids tend to remain at the bonded interface and become origins of cracking and the like. In the present embodiment, on the other hand, Cu (Cu in the Cu—Mo composite material and the Cu material) of both members are diffusion bonded, so that a sound bonded part is obtained without an oxide film or fine voids remaining at the bonded interface.

Figure 2:
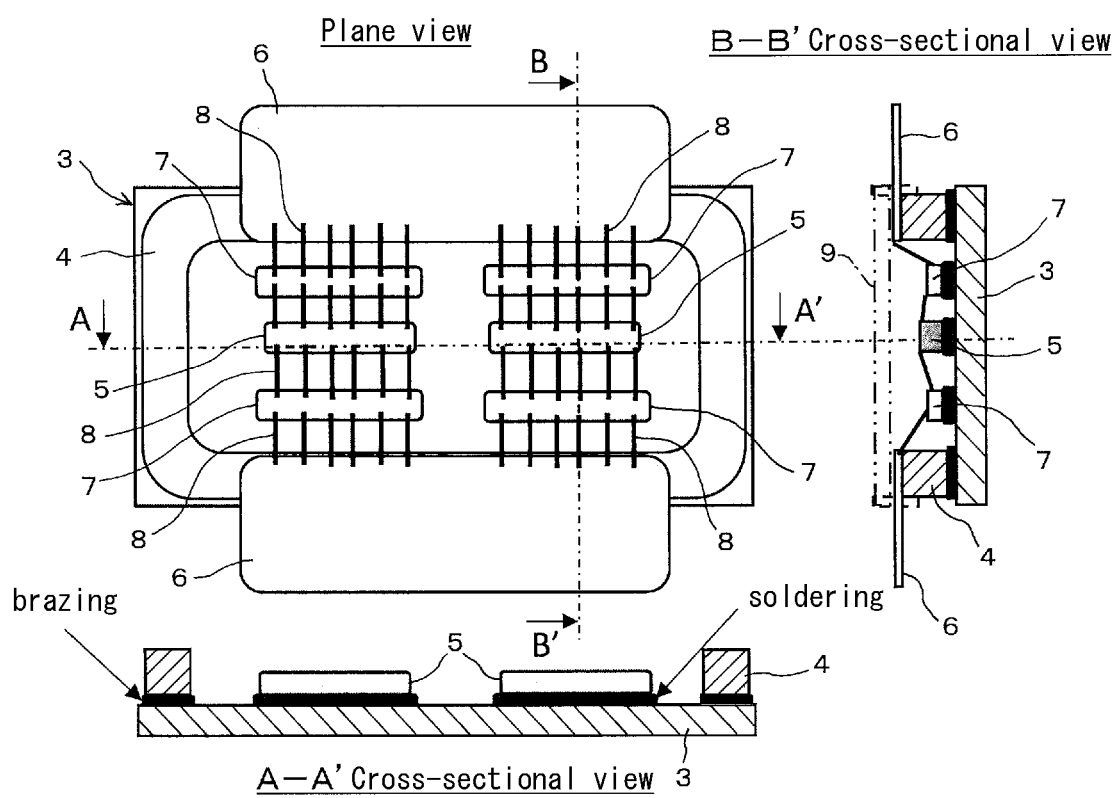
FIG. 2 is an explanatory diagram schematically illustrating an example of a semiconductor package to which the heat sink of one of the disclosed embodiments is applied, and includes a plane view illustrating the semiconductor package without a lid constituting the package case, and a cross-sectional view along line A-A' and a cross-sectional view along line B-B' of the plan view.

The heat sink of the present embodiment is particularly suitable for a semiconductor package with a frame in which a high-output and small-sized semiconductor is directly bonded to the heat sink as described above. FIG. 2, which is an explanatory diagram schematically illustrating an example of such a semiconductor package with a frame, includes a plane view illustrating the semiconductor package without a lid constituting the package case, and a cross-sectional view along line A-A' and a cross-sectional view along line B-B' of the plan view. In this example, a ceramic frame 4, which serves as a part of the package case (sealing member) to hold a semiconductor and as an insulating member for electrodes, is bonded (brazed) to a heat sink 3 as a base, and the semiconductor 5 and a capacitor 7 are bonded (soldered) to the heat sink 3 inside the ceramic frame 4. A part of an electrode 6 is overlapped on the upper surface of a part (long side part) of the ceramic frame 4, and the electrode 6 and the semiconductor 5 are electrically connected by a connection wire 8 via the capacitor 7. A lid 9 is attached to the ceramic frame 4 overlapped with a part of the electrode 6 to constitute the package case.

Figure 3:
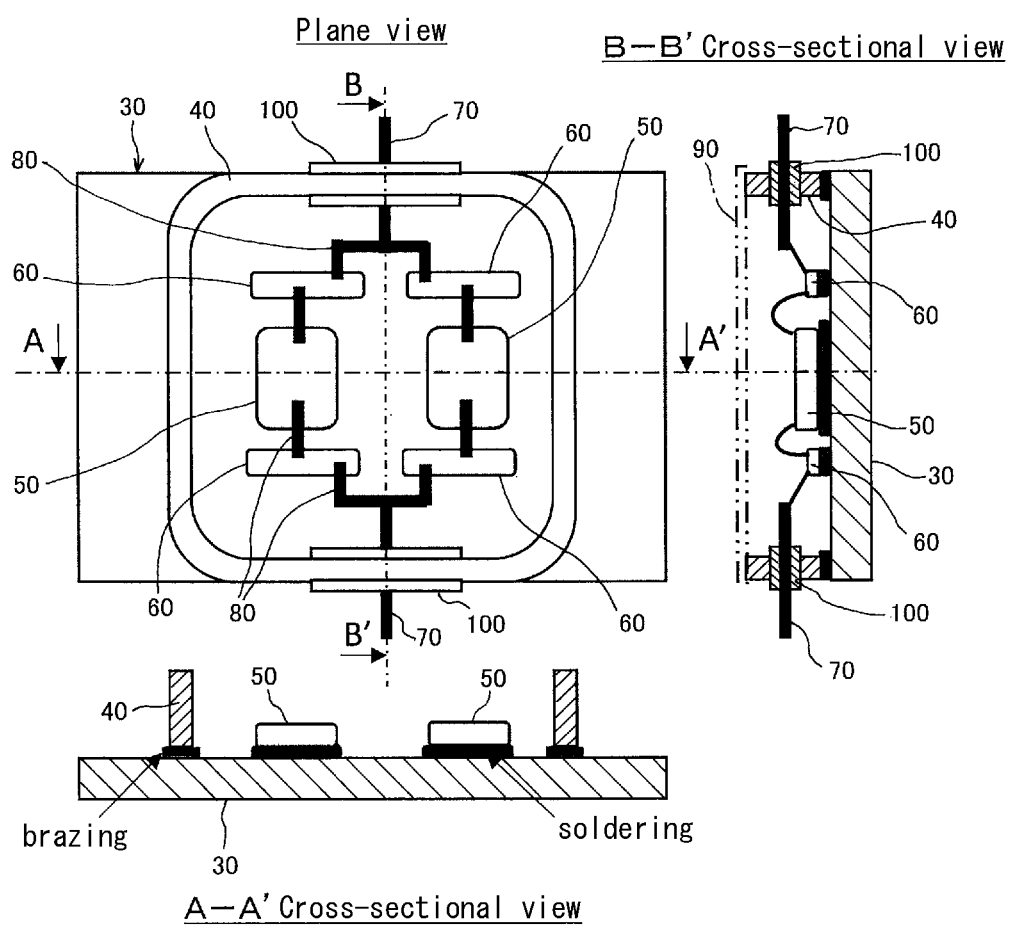
FIG. 3 is an explanatory diagram schematically illustrating another example of a semiconductor package to which a heat sink of one of the disclosed embodiments is applied, and includes a plane view illustrating the semiconductor package without a lid constituting the package case, and a cross-sectional view along line A-A' and a cross-sectional view along line B-B' of the plan view.

FIG. 3 is an explanatory diagram schematically illustrating another example of the semiconductor package with a frame (including a plane view illustrating the semiconductor package without a lid constituting the package case, and a cross-sectional view along line A-A' and a cross-sectional view along line B-B' of the plan view). FIG. 3 illustrates an example in which the frame is made of a metal with a low coefficient of thermal expansion, such as Kovar instead of ceramic.

In this semiconductor package, a metal frame 40 (frame made of a metal with a low coefficient of thermal expansion), which serves as a part of the package case (sealing member) to hold a semiconductor and as an insulating member for electrodes, is bonded (brazed) to a heat sink 30 as a base, and a semiconductor 50 and an electrode 60 are bonded (soldered) to the heat sink 30 inside the metal frame 40. An electrode 70 is attached to the metal frame 40 via an insulator 100, and the electrode 70 and the semiconductor 50 are electrically connected by a connection wire 80 via the electrode 60. A lid 90 is attached to the metal frame 40 to constitute a package case.

In the heat sink of the present embodiment, the Cu layers as the outermost layers (hereinafter, referred to as "outermost Cu layer" for convenience of explanation) provided on both sides each have a thickness $t_1$ of 40 μm or more, and the heat sink satisfies $0.06 \leq t_1/T \leq 0.27$, where T denotes a heat sink thickness, and $t_2/T \leq 0.36/[(\text{total number of layers}-1)/2]$, where $t_2$ denotes a thickness of each of the Cu—Mo composite layers (hereinafter, also referred to as "Cu—Mo layer" for convenience) and the total number of layers is a sum of the number of the Cu layers and the number of the Cu—Mo layers.

One of the purposes of the present embodiment is to prevent, when the heat sink is applied to the semiconductor package with a frame as described above, crack of the ceramic frame constituting the semiconductor package due to local stress concentration. By setting the thickness $t_1$ of each outermost Cu layer to 40 μm or more, the stress relaxation effect of the outermost Cu layer can be obtained, which effectively prevents the ceramic frame (e.g., about 0.5 mm thick) from cracking due to local stress concentration. If the outermost Cu layer thickness $t_1$ is less than 40 μm, the stress relaxation effect is not sufficiently obtained and the ceramic frame may be cracked. The ceramic frame varies in susceptibility to cracking in accordance with the thickness, size, material property, and the like. Since as the outermost Cu layer thickness $t_1$ is larger, the stress relaxation effect increases, it is preferable to select the outermost Cu layer thickness $t_1$ appropriately according to the thickness, size, and material property of the ceramic frame. No upper limit is placed on the outermost Cu layer thickness $t_1$. The thickness $t_1$ may be, for example, 810 μm or less.

When the ratio of the outermost Cu layer thickness $t_1$ to the heat sink thickness T represented by $t_1/T$ is less than 0.06, the thermal conductivity in the thickness direction is high but the heat spread (heat dissipation) in the in-plane direction in the outermost Cu layer is not sufficient. A high-output and small-sized semiconductor generates a large amount of heat per unit area, and a large amount of heat is applied to a small area where the semiconductor and the heat sink come into contact. Therefore, in the early stage of semiconductor start-up, heat dissipation is not sufficient and the temperature may increase rapidly. On the other hand, when the ratio $t_1/T$ exceeds 0.27, the thermal conductivity in the thickness direction decreases and a heat sink with high thermal conductivity cannot be obtained. In detail, in the case of a clad structure having Cu layers and Cu—Mo layers alternately stacked so that the two of the Cu layers are outermost layers on both sides thereof, the thermal conductivity of the outer layers (Cu layers) is higher than that of the inner layers (Cu—Mo layers), so that the heat entering the outer layers (Cu layers) is reflected and scattered at the interface between the outer and inner layers to disturb the heat flow. Therefore, the heat does not transfer to the inner layers (Cu—Mo layers) well, and high heat transfer resistance occurs at the interface between the outer and inner layers, which is considered to reduce the thermal conductivity in the thickness direction. The decrease in thermal conductivity in the thickness direction due to these causes depends on the thickness of the outermost Cu layer. As the thickness of the outermost Cu layer is larger, the amount of heat that is reflected and scattered at the interface between the outermost Cu layer and the inner layer increases, and thus the degree of deterioration in thermal conductivity increases.

For these reasons, in the present embodiment, the ratio $t_1/T$ is set to 0.06 or more and 0.27 or less. For the same reason, a ratio $t_1/T$ is preferably 0.10 or more, and more preferably 0.12 or more. Similarly, the ratio $t_1/T$ is preferably 0.20 or less, and more preferably 0.18 or less.

The heat sink of the present embodiment can satisfy the high heat-sink properties particularly required of a heat sink for a semiconductor package with a frame on which a high-output and small-sized semiconductor is mounted by setting the ratio $t_1/T$ to be 0.06 or more and 0.27 or less and the ratio of the thickness $t_2$ of each Cu—Mo layer to the heat sink thickness T to be $t_2/T \leq 0.36/[(\text{total number of layers}-1)/2]$, where the total number of layers is a sum of the number of the Cu layers and the number of the Cu—Mo layers. For this reason, $t_2/T \leq 0.36/[(\text{total number of layers}-1)/2]$ is used in the present embodiment. $t_2/T \leq 0.30/[(\text{total number of layers}-1)/2]$ is preferably used. Thus, for example, a heat sink having a five-layer clad structure has $t_2/T \leq 0.18$, preferably $t_2/T \leq 0.15$. A heat sink having a seven-layer clad structure has $t_2/T \leq 0.12$, preferably $t_2/T \leq 0.10$. A heat sink having a nine-layer clad structure has $t_2/T \leq 0.09$, preferably $t_2/T \leq 0.075$. A heat sink having an eleven-layer clad structure has $t_2/T \leq 0.072$, preferably $t_2/T \leq 0.06$.

No lower limit is particularly placed on $t_2/T$. When the heat sink thickness is larger, a heat sink having smaller $t_2/T$ can be manufactured. From the viewpoint of the rollability when rolling is performed after cladding, the lower limit is preferably about $t_2/T=0.16/[(\text{total number of layers}-1)/2]$.

Satisfying high heat-sink properties means that (i) the thermal conductivity in the thickness direction should be as high as possible, (ii) the difference between the thermal conductivity in the thickness direction and that in the in-plane direction should be small, i.e., the ratio (%) of the thermal conductivity in the thickness direction to the thermal conductivity in the in-plane direction should be high (the value should be close to "100%"), and (iii) for the thermal conductivity in the thickness direction, the difference between the measured value and the calculated value is small, i.e., the ratio (%) of the thermal conductivity in the thickness direction (measured value) to the thermal conductivity in the thickness direction (calculated value) calculated according to the simple rule of mixture is high.

For the semiconductor package with a frame on which a high-output and small-sized semiconductor is mounted, it is extremely important to have high heat-sink properties of the above thermal properties (i) to (iii), that is, to have as high a thermal conductivity in the thickness direction as possible and to stably obtain that high thermal conductivity, and additionally to have well-balanced heat dissipation in the thickness direction and in-plane direction. As described in detail below, the heat sink of the present embodiment has high heat-sink properties of the above thermal properties (i) to (iii).

As to the Thermal Property (i)

In the semiconductor package with a frame on which a high-output and small-sized semiconductor is mounted, the thermal conductivity in the thickness direction of the heat sink must be as high as possible.

Figure 4:
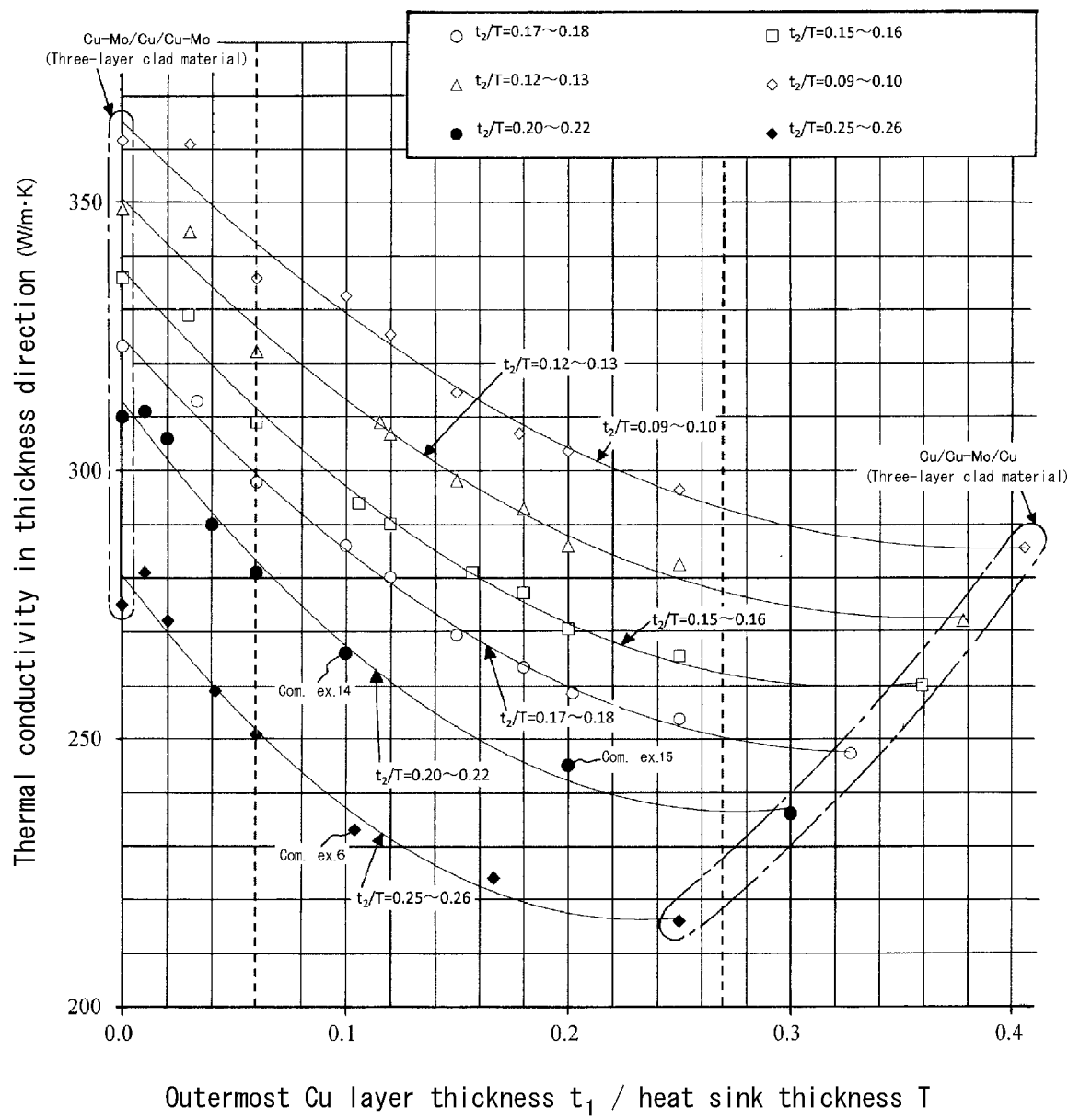
FIG. 4 is a graph illustrating the thermal conductivity in the thickness direction of a part of the heat sinks of the EXAMPLES section below in relation to the ratio of the outermost Cu layer thickness $t_1$ to the heat sink thickness T represented by $t_1/T$ and to the ratio of the Cu—Mo composite layer thickness $t_2$ to the heat sink thickness T represented by $t_2/T$.

FIG. 4 illustrates the thermal conductivity in the thickness direction at room temperature of a part of the heat sinks (a part of the five-layer clad materials) of the EXAMPLES section below in relation to the ratio of the outermost Cu layer thickness $t_1$ to the heat sink thickness T represented by $t_1/T$ and to the ratio of the Cu—Mo composite layer thickness $t_2$ to the heat sink thickness T represented by $t_2/T$. In FIG. 4, results for heat sinks having a ratio $t_2/T=0.25$ or more and 0.26 or less are marked by black diamonds, results for heat sinks having a ratio $t_2/T=0.20$ or more and 0.22 or less are marked by black dots, results for heat sinks having a ratio $t_2/T=0.17$ or more and 0.18 or less are marked by white dots, results for heat sinks having a ratio $t_2/T=0.15$ or more and 0.16 or less are marked by squares, results for heat sinks having a ratio $t_2/T=0.12$ or more and 0.13 or less are marked by triangles, results for heat sinks having a ratio $t_2/T=0.09$ or more and 0.10 or less are marked by white diamonds. The approximate curve for the plots having the same mark is illustrated as a solid line. However, the plots at both ends of the solid line are the date for three-layer clad materials. Among these five-layer clad materials, those having a ratio $t_2/T \leq 0.18$ (marked by white dots, squares, triangles, and white diamonds) satisfy $t_2/T \leq 0.36/[$(total number of layers−1)/2$]$ of the present embodiment. According to FIG. 4, in the case of having the same ratio $t_1/T$ and same outermost Cu layer thickness $t_1$, that is, in the case of having comparable heat dissipation properties in the in-plane direction of the outermost Cu layer and equivalent relaxation effect of the stress generated at a bonded interface between the ceramic frame and the heat sink, in the range of $0.06 \leq t_1/T \leq 0.27$, the heat sinks having the ratio $t_2/T \leq 0.18$ (marked by white dots, squares, triangles, and white diamonds) of the present embodiment have a higher thermal conductivity in the thickness direction than the heat sinks having the ratio $t_2/T=0.25$ or more and 0.26 or less (marked by black diamonds) and the ratio $t_2/T=0.20$ or more and 0.22 or less (marked by black dots) by 10 W/m·K or more and 20 W/m·K or less. Since the heat sinks of the examples illustrated in FIG. 4 all have the thickness of 1 mm, if the ratio $t_1/T$ is the same, the outermost Cu layer thickness $t_1$ is also the same. The plots indicated as "Com. ex. 6" (Comparative example 6), "Com. ex. 14" (Comparative example 14), and "Com. ex. 15" (Comparative example 15) in the figure are heat sinks having ratios $t_2/T=0.26$, 0.21, and 0.20, respectively described in Conventional Technique 2 (Patent Document 2). In the range of $0.06 \leq t_1/T \leq 0.27$, the heat sinks having the ratio $t_2/T \leq 0.18$ (marked by white dots, squares, triangles, and white diamonds) of the present embodiment have a high thermal conductivity in the thickness direction of 250 W/m·K or more.

As to the Thermal Property (ii)

Figure 5:
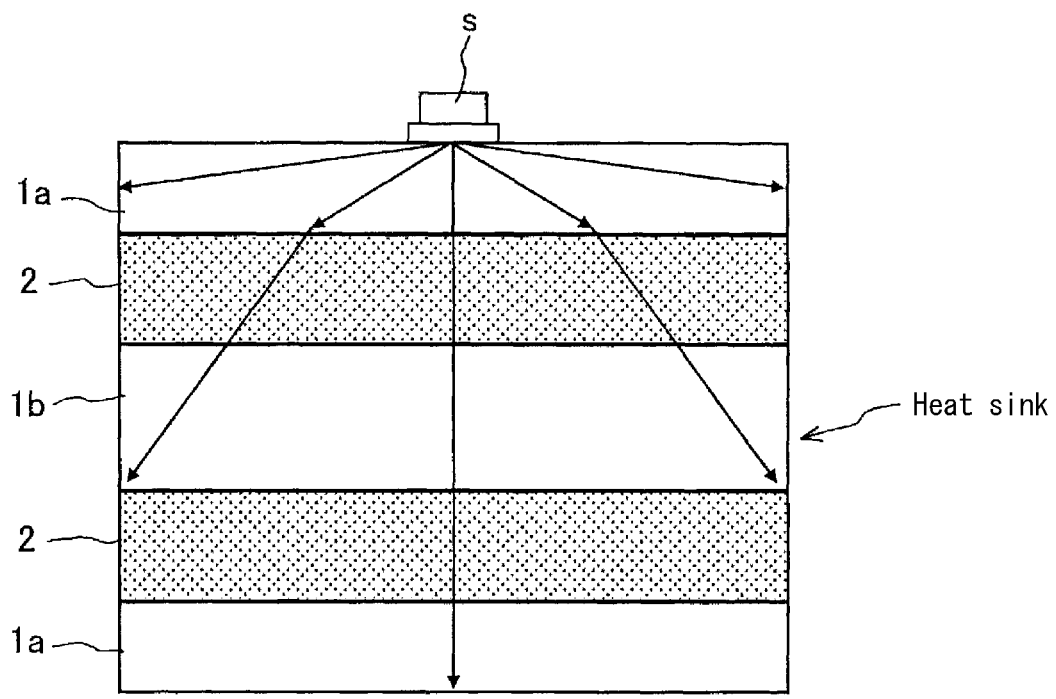
FIG. 5 illustrates the heat dissipation balance in the thickness direction and in-plane direction of a heat sink.

In the semiconductor package with a frame in which a high-output and small-sized semiconductor is directly bonded to a heat sink, it is essential to efficiently dissipate heat by allowing heat to dissipate in the thickness direction while allowing heat to escape in the in-plane direction of the heat sink. Therefore, it is important that heat can dissipate in the thickness direction and in the in-plane direction in a well-balanced manner, specifically, the ratio (%) of the thermal conductivity in the thickness direction to the thermal conductivity in the in-plane direction is high. FIG. 5 schematically illustrates the heat dissipation in the thickness direction and in-plane direction of the heat sink, where s is a semiconductor directly bonded to the heat sink. FIG. 5 illustrates a cross section along the thickness direction of the heat sink, in which the arrows indicate the heat flow. The high-output and small-sized semiconductor s is easily heated to high temperature due to the large amount of heat generated per unit area. As illustrated in FIG. 5, the heat sink must not only dissipate the heat of the semiconductor s in the thickness direction, but also in the in-plane direction and eventually in the thickness direction, and for this reason it is important that the heat dissipates in the thickness and in-plane directions in a well-balanced manner. The ratio of the thermal conductivity in the thickness direction to the thermal conductivity in the in-plane direction is preferably 75% or more, more preferably 80% or more, and further preferably 85% or more.

Figure 6:
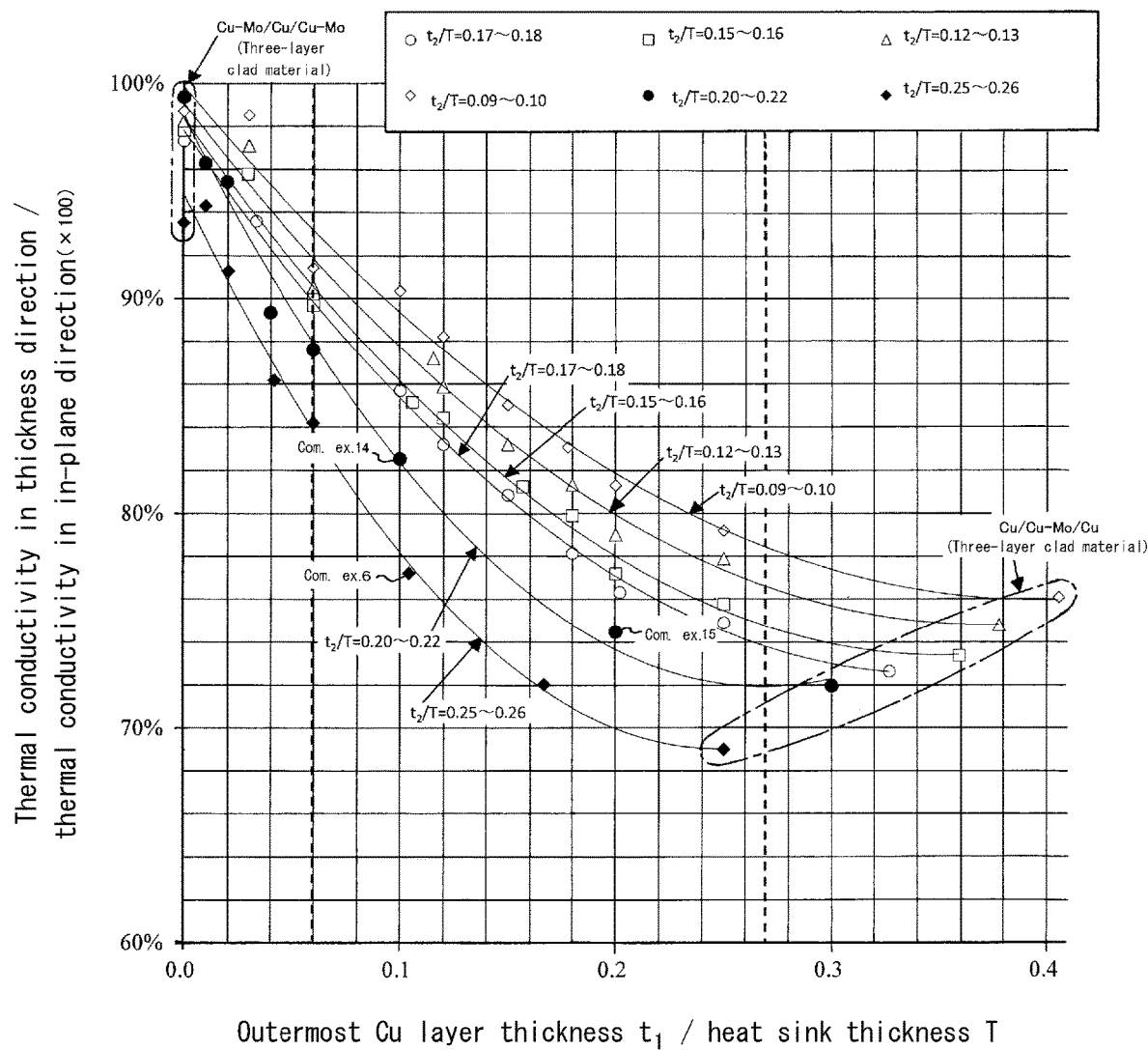
FIG. 6 is a graph illustrating the ratio (%) of the thermal conductivity in the thickness direction to the thermal conductivity in the in-plane direction of a part of the heat sinks of the EXAMPLES section below in relation to the ratio of the outermost Cu layer thickness $t_1$ to the heat sink thickness T represented by $t_1/T$ and to the ratio of the Cu—Mo composite layer thickness $t_2$ to the heat sink thickness T represented by $t_2/T$.

FIG. 6 illustrates the ratio (%) of the thermal conductivity in the thickness direction to the thermal conductivity in the in-plane direction (both at room temperature) of a part of the heat sinks (a part of the five-layer clad materials) of the EXAMPLES section below in relation to the ratio of the outermost Cu layer thickness $t_1$ to the heat sink thickness T represented by $t_1/T$ and to the ratio of the Cu—Mo composite layer thickness $t_2$ to the heat sink thickness T represented by $t_2/T$.

Also in FIG. 6, results for heat sinks having a ratio $t_2/T=0.25$ or more and 0.26 or less are marked by black diamonds, results for heat sinks having a ratio $t_2/T=0.20$ or more and 0.22 or less are marked by black dots, results for heat sinks having a ratio $t_2/T=0.17$ or more and 0.18 or less are marked by white dots, results for heat sinks having a ratio $t_2/T=0.15$ or more and 0.16 or less are marked by squares, results for heat sinks having a ratio $t_2/T=0.12$ or more and 0.13 or less are marked by triangles, and results for heat sinks having a ratio $t_2/T=0.09$ or more and 0.10 or less are marked by white diamonds. The approximate curve for the plots having the same mark is illustrated as a solid line. However, the plots at both ends of the solid line are the date for three-layer clad materials. Among these five-layer clad materials, those having a ratio $t_2/T \leq 0.18$ (marked by white dots, squares, triangles, and white diamonds) satisfy $t_2/T \leq 0.36/[$(total number of layers−1)/2$]$ of the present embodiment. According to FIG. 6, in the case of having the same ratio $t_1/T$ and same outermost Cu layer thickness $t_1$, that is, in the case of having comparable heat dissipation properties in the in-plane direction of the outermost Cu layer and equivalent relaxation effect of the stress generated at a bonded interface between the ceramic frame and the heat sink, in the range of $0.06 \leq t_1/T \leq 0.27$, the heat sinks having the ratio $t_2/T \leq 0.18$ (marked by white dots, squares, triangles, and white diamonds) of the present embodiment, which have 2% or more higher ratio of thermal conductivity in the thickness direction to the thermal conductivity in the in-plane direction than the heat sinks having the ratio $t_2/T=0.25$ or more and 0.26 or less (marked by black diamonds) and the ratio $t_2/T=0.20$ or more and 0.22 or less (marked by black dots), are considered to be able to dissipate the heat of the semiconductor in the thickness and in-plane directions in a well-balanced manner. Since the heat sinks of the examples illustrated in FIG. 6 all have the thickness of 1 mm, if the ratio $t_1/T$ is the same, the outermost Cu layer thickness $t_1$ is also the same. The plots indicated as "Com. ex. 6" (Comparative example 6), "Com. ex. 14" (Comparative example 14), and "Com. ex. 15" (Comparative example 15) in the figure are heat sinks having ratios $t_2/T=0.26$, 0.21, and 0.20, respectively described in Conventional Technique 2 (Patent Document 2).

As to the Thermal Property (iii)

The ratio (%) of the thermal conductivity in the thickness direction (measured value) to the thermal conductivity in the thickness direction (calculated value) calculated according to the simple rule of mixture indicates the degree of deviation of the measured value from the calculated value of the thermal conductivity in the thickness direction. As the ratio is higher, the heat flow loss in the thickness direction due to interface thermal resistance between the layers, etc. decreases and thus a desired high thermal conductivity can be stably obtained. This is an important property for efficient heat dissipation in a semiconductor package with a frame in which a high-output and small-sized semiconductor is directly bonded to the heat sink. The ratio of the thermal conductivity in the thickness direction (measured value) to the thermal conductivity in the thickness direction (calculated value) calculated according to the simple rule of mixture is preferably 80% or more, more preferably 84% or more, and further preferably 87% or more.

The thermal conductivity $\lambda_c$ in the thickness direction calculated according to the simple rule of mixture is determined by the following equation:

Calculated thermal conductivity $\lambda_c = V_{Cu-Mo} \times \lambda_{Cu-Mo} + V_{Cu} \times \lambda_{Cu}$ where
$V_{Cu-Mo}$ is the volume fraction of the Cu—Mo layer,
$V_{Cu}$ is the volume fraction of the Cu layer,
$\lambda_{Cu-Mo}$ is the thermal conductivity of the Cu—Mo layer in the thickness direction, and
$\lambda_{Cu}$ is the thermal conductivity of pure Cu (=405 W/m·K).
$\lambda_{Cu-Mo}$ is determined by the Mo content in the Cu—Mo layer and the rolling reduction ratio of the Cu—Mo layer. The rolling reduction ratio of the Cu—Mo layer refers to the total rolling reduction ratio that is the sum of the rolling reduction ratio of the Cu—Mo composite material before cladding and the rolling reduction ratio of the clad material during the manufacture of the heat sink. However, if the Cu—Mo composite material is not rolled before cladding, the rolling reduction ratio of the Cu—Mo layer refers to the rolling reduction ratio of the clad material.

Figure 7:
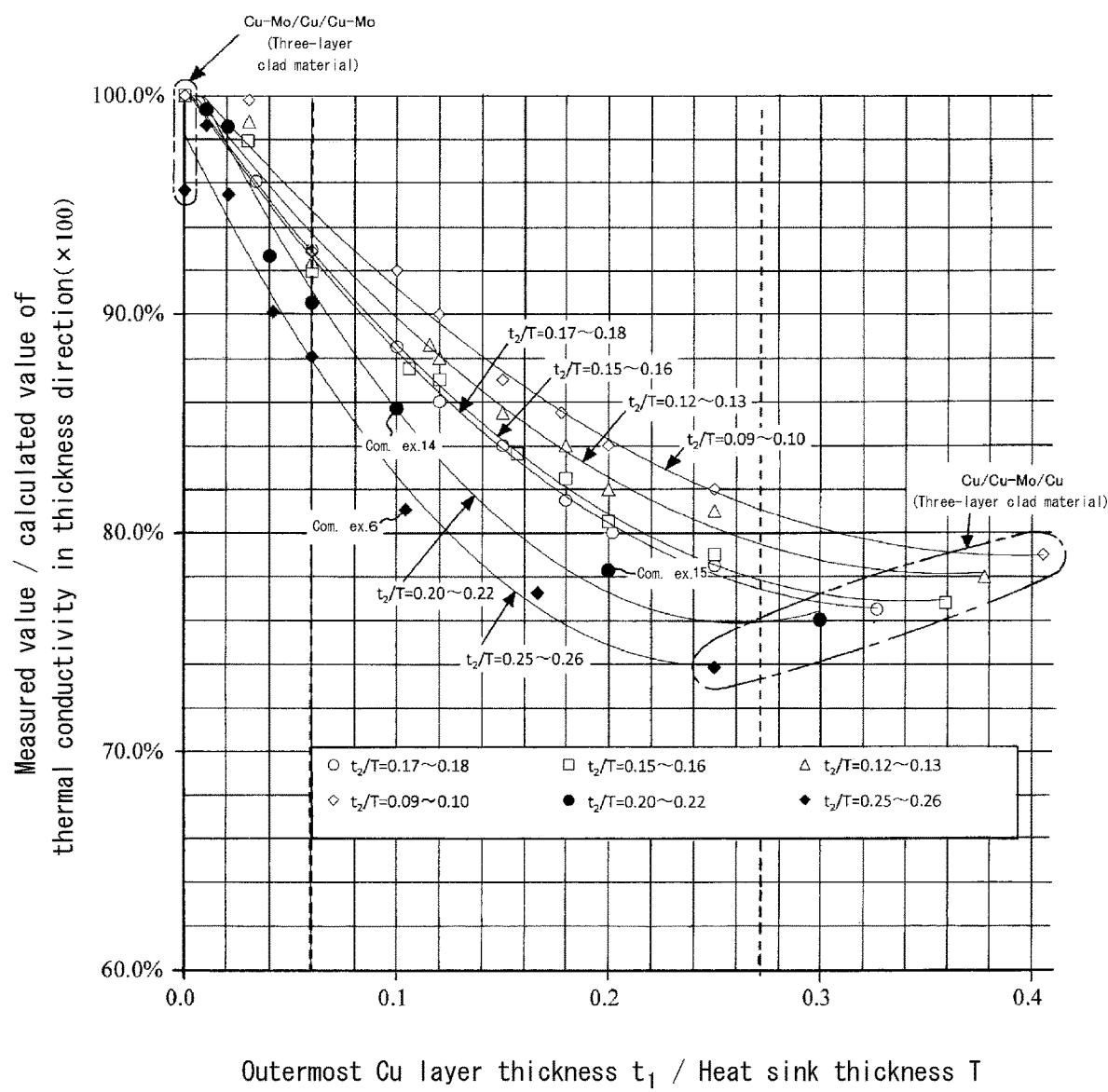
FIG. 7 is a graph illustrating the ratio (%) of the thermal conductivity in the thickness direction (measured value) to the thermal conductivity in the thickness direction (calculated value) calculated according to the simple rule of mixture of a part of the heat sinks of the EXAMPLES section below in relation to the ratio of the outermost Cu layer thickness $t_1$ to the heat sink thickness T represented by $t_1/T$ and to the ratio of the Cu—Mo composite layer thickness $t_2$ to the heat sink thickness T represented by $t_2/T$.

FIG. 7 illustrates the ratio (%) of the thermal conductivity in the thickness direction (measured value) at room temperature to the thermal conductivity in the thickness direction (calculated value) calculated according to the simple rule of mixture of a part of the heat sinks (a part of the five-layer clad materials) of the EXAMPLES section below in relation to the ratio of the outermost Cu layer thickness $t_1$ to the heat sink thickness T represented by $t_1/T$ and to the ratio of the Cu—Mo composite layer thickness $t_2$ to the heat sink thickness T represented by $t_2/T$.

Also in FIG. 7, results for heat sinks having a ratio $t_2/T=0.25$ or more and 0.26 or less are marked by black diamonds, results for heat sinks having a ratio $t_2/T=0.20$ or more and 0.22 or less are marked by black dots, results for heat sinks having a ratio $t_2/T=0.17$ or more and 0.18 or less are marked by white dots, results for heat sinks having a ratio $t_2/T=0.15$ or more and 0.16 or less are marked by squares, results for heat sinks having a ratio $t_2/T=0.12$ or more and 0.13 or less are marked by triangles, and results for heat sinks having a ratio $t_2/T=0.09$ or more and 0.10 or less are marked by white diamonds. The approximate curve for the plots having the same mark is illustrated as a solid line. However, the plots at both ends of the solid line are the date for three-layer clad materials. Among these five-layer clad materials, those having a ratio $t_2/T \leq 0.18$ (marked by white dots, squares, triangles, and white diamonds) satisfy $t_2/T \leq 0.36/[(\text{total number of layers}-1)/2]$ of the present embodiment. According to FIG. 7, in the case of having the same ratio $t_1/T$ and same outermost Cu layer thickness $t_1$, that is, in the case of having comparable heat dissipation properties in the in-plane direction of the outermost Cu layer and equivalent relaxation effect of the stress generated at a bonded interface between the ceramic frame and the heat sink, in the range of $0.06 \leq t_1/T \leq 0.27$, the heat sinks having the ratio $t_2/T \leq 0.18$ (marked by white dots, squares, triangles, and white diamonds) of the present embodiment, which have 2% or more higher ratio of the measured value to the calculated value of the thermal conductivity in the thickness direction than the heat sinks having the ratio $t_2/T=0.25$ or more and 0.26 or less (marked by black diamonds) and the ratio $t_2/T=0.20$ or more and 0.22 or less (marked by black dots), are considered to be able to stably obtain a desired high thermal conductivity. Since the heat sinks of the examples illustrated in FIG. 7 all have the thickness of 1 mm, if the ratio $t_1/T$ is the same, the outermost Cu layer thickness $t_1$ is also the same. The plots indicated as "Com. ex. 6" (Comparative example 6), "Com. ex. 14" (Comparative example 14), and "Com. ex. 15" (Comparative example 15) in the figure are heat sinks having ratios $t_2/T=0.26$, 0.21, and 0.20, respectively described in Conventional Technique 2 (Patent Document 2).

Figure 8:
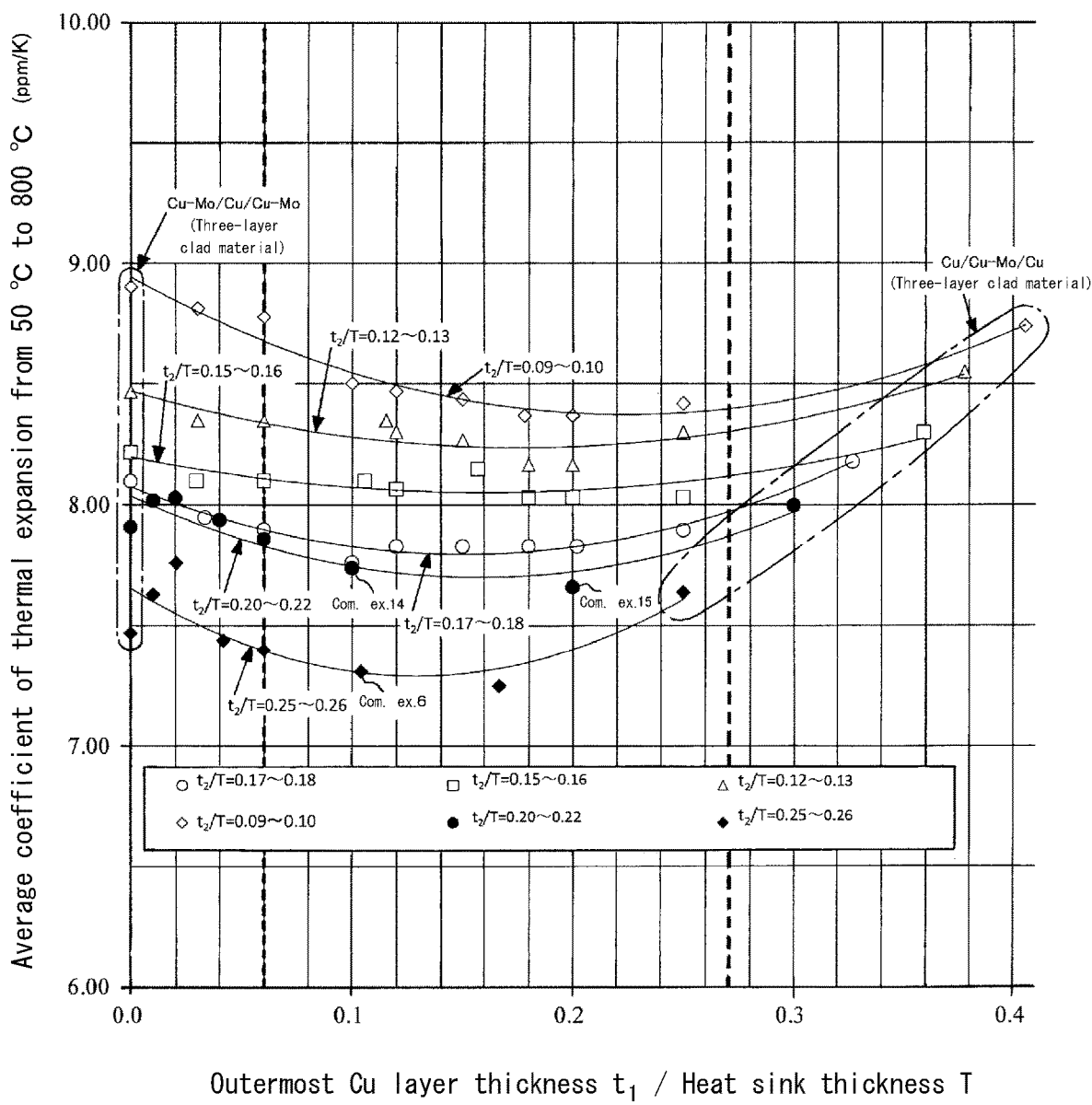
FIG. 8 is a graph illustrating the average coefficient of thermal expansion in the in-plane direction from 50° C. to 800° C. of a part of the heat sinks of the EXAMPLES section below in relation to the ratio of the outermost Cu layer thickness $t_1$ to the heat sink thickness T represented by $t_1/T$, and to the ratio of the Cu—Mo composite layer thickness $t_2$ to the heat sink thickness T represented by $t_2/T$.

The heat sink of the present embodiment also provides good values for the average coefficient of thermal expansion in the in-plane direction. FIG. 8 illustrates the average coefficient of thermal expansion in the in-plane direction from 50° C. to 800° C. of a part of the heat sinks (a part of the five-layer clad materials) of the EXAMPLES section below in relation to the ratio of the outermost Cu layer thickness $t_1$ to the heat sink thickness T represented by $t_1/T$, and to the ratio of the Cu—Mo layer thickness $t_2$ to the heat sink thickness T represented by $t_2/T$.

Also in FIG. 8, results for heat sinks having a ratio $t_2/T=0.25$ or more and 0.26 or less are marked by black diamonds, results for heat sinks having a ratio $t_2/T=0.20$ or more and 0.22 or less are marked by black dots, results for heat sinks having a ratio $t_2/T=0.17$ or more and 0.18 or less are marked by white dots, results for heat sinks having a ratio $t_2/T=0.15$ or more and 0.16 or less are marked by squares, results for heat sinks having a ratio $t_2/T=0.12$ or more and 0.13 or less are marked by triangles, and results for heat sinks having a ratio $t_2/T=0.09$ or more and 0.10 or less are marked by white diamonds. The approximate curve for the plots having the same mark is illustrated as a solid line. However, the plots at both ends of the solid line are the date for three-layer clad materials. Among these five-layer clad materials, those having a ratio $t_2/T \leq 0.18$ (marked by white dots, squares, triangles, and white diamonds) satisfy $t_2/T \leq 0.36/[(\text{total number of layers}-1)/2]$ of the present embodiment. According to FIG. 8, in the range of $0.06 \leq t_1/T \leq 0.27$, the heat sinks of the present embodiment having the ratio $t_2/T \leq 0.18$ (marked by white dots, squares, triangles, and white diamonds), which have an average coefficient of thermal expansion in the in-plane direction from 50° C. to 800° C. of 9.0 ppm/K or less, are considered to have a low coefficient of thermal expansion.

In the present embodiment, the coefficient of thermal expansion in the in-plane direction is measured by the pushrod-type displacement detection method. The "average coefficient of thermal expansion in the in-plane direction from 50° C. to 800° C." is obtained by determining the difference in elongation at 50° C. and 800° C. and dividing that value by the temperature difference of 750° C. (=800° C.−50° C.).

The thermal conductivities in the thickness direction and in-plane direction (both at room temperature) are measured by the laser flash technique. The thermal conductivity in the thickness direction is measured by a well-known method in which a laser beam is irradiated to the front surface in the thickness direction of the sample (heat sink) and the temperature of the back surface is measured by an infrared sensor to obtain the thermal diffusivity.

Figure 9:
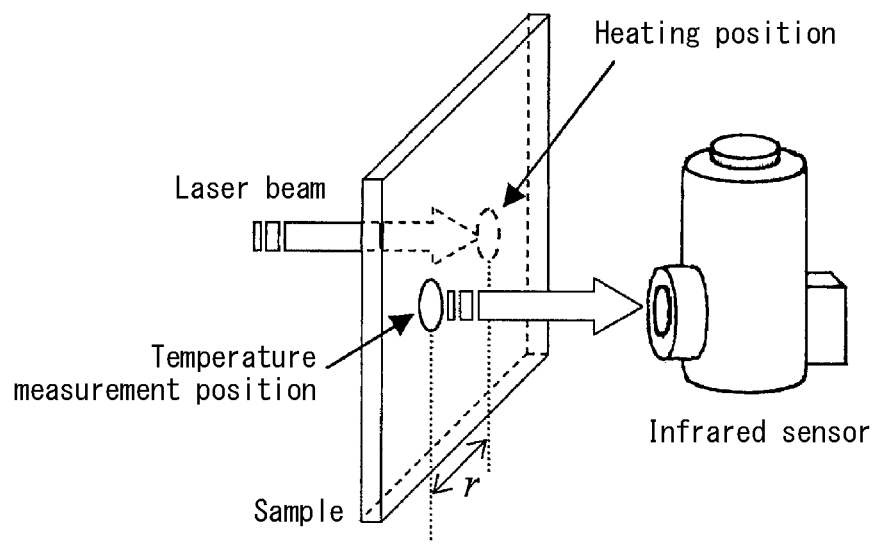
FIG. 9 is an explanatory diagram illustrating the principle of measuring the thermal diffusivity in in-plane direction by the laser flash technique.
Figure 10:
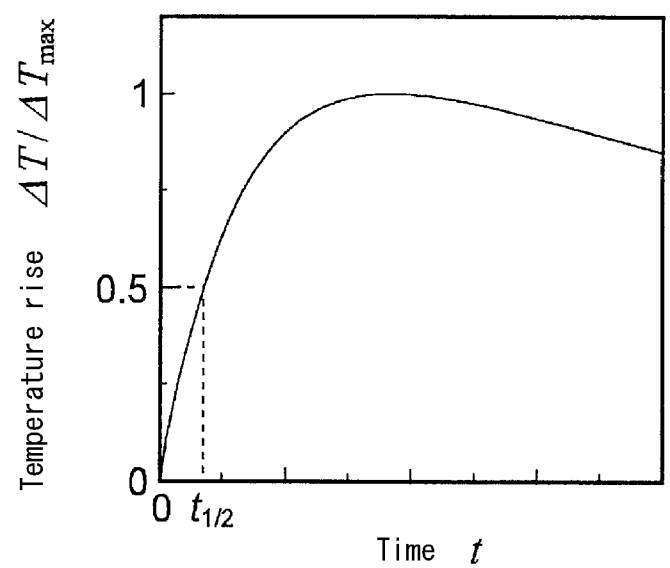
FIG. 10 illustrates the temperature rise curve of the temperature measurement position in the measurement method of FIG. 9.

On the other hand, the thermal conductivity in the in-plane direction is measured by obtaining the thermal diffusivity as follows. FIG. 9 illustrates the principle of measuring the thermal diffusivity in the in-plane direction by the laser flash technique. FIG. 9 is based on materials from Toray Research Center, Inc. A spot laser beam (pulse laser beam) is irradiated to a part of the front surface of the sample (heat sink) for local heating. On the surface (back side) opposite to the laser beam irradiation side, the temperature of the sample at a distance r (m) horizontally separated from the above irradiation position is measured with an infrared sensor. The temperature change $\Delta T$ at this time represents a temperature rise curve as illustrated in FIG. 10. If the time to reach ½ of the maximum temperature rise $\Delta T_{max}$ is $t_{1/2}$, then $t_{1/2}=K_1 r^2/t_{1/2}$ is obtained. The constant $K_1$ is a constant specific to the optical system of the measurement device, which depends on the size of the part heated by laser light irradiation, the distance between the heating position by laser light irradiation and the position at which the temperature is measured by the infrared sensor, and the size of the part measured, and can be determined using a standard sample. If $t_{1/2}$ is measured, the thermal diffusivity a can be determined from the following formula (1):

$$\alpha = K_1 \times (r^2/t_{1/2}) \qquad (1).$$

Then, the thermal conductivity in the in-plane direction is determined from the thermal diffusivity a as well as the thermal conductivity in the thickness direction.

Although there is no restriction to the Mo content of the Cu—Mo layer, the Mo content is preferably 50 mass % or more. The Mo content is preferably 80 mass % or less. The Mo content of the Cu—Mo layer is more preferably 60 mass % or more. The Mo content is more preferably 80 mass % or less. The Mo content is particularly preferably 70 mass % or more. The Mo content is particularly preferably 80 mass % or less. In order to suitably obtain the effect of improving the thermal conductivity of the heat sink and suppressing the thermal expansion of the intermediate Cu layer, that is, the effect of physically constraining the intermediate Cu layer by sandwiching it from both sides, the Mo content is preferably 50 mass % or more, more preferably 60 mass % or more, and particularly preferably 70 mass % or more. On the other hand, from the viewpoint of suitably preventing a decrease in thermal conductivity and obtaining better cold rolling manufacturability, the Mo content is preferably 80 mass % or less.

The Cu—Mo layer (Cu—Mo composite layer) may have a structure in which the entire Cu—Mo layer is composed of a single unit Cu—Mo composite material, or it may have a structure in which a plurality of unit Cu—Mo composite layers are stacked with a very thin Cu layer for bonding being interposed therebetween. If the thickness of the Cu layer for bonding is about 75 μm or less, it will have little effect on the thermal properties of the heat sink, so its thickness is preferably 75 μm or less, and more preferably 25 μm or less. No lower limit is placed on the thickness of the Cu layer for bonding, but the thickness can be, for example, 1 μm or more. This Cu layer for bonding constitutes a part of the Cu—Mo layer and is different from and is not included in the Cu layer that is alternately stacked with the Cu—Mo layer in the heat sink.

The Cu layer may be composed entirely of a single unit of Cu or may have a structure in which a plurality of unit Cu layers are stacked together.

As described below, the heat sink of the present embodiment is manufactured by alternately stacking Cu—Mo composite materials (a) and Cu materials (b) to obtain a laminate, diffusion bonding the laminate, and then rolling it. The Cu—Mo composite material (a) used in this manufacture is not limited to a single sheet material but may also comprise a plurality of thin Cu—Mo composite materials (unit Cu—Mo composite materials) that are stacked together. This is because the Cu—Mo composite material may become thinner when the rolling reduction ratio is increased. In the case where the Cu—Mo composite material (a) is composed of a plurality of thin unit Cu—Mo composite materials stacked together, especially where the Cu content of each of the Cu—Mo composite materials is relatively low, in order to increase the bondability between the unit Cu—Mo composite materials, it is preferable to stack the plurality of unit Cu—Mo composite materials with a thin Cu sheet (such as Cu foil) being interposed therebetween, that is, to interpose a thin Cu sheet between adjacent unit Cu—Mo composite materials and diffusion bond the unit Cu—Mo composite materials with the thin Cu sheet therebetween. The foregoing Cu layer for bonding in the Cu—Mo layer of the heat sink is obtained by stretching the thin Cu sheet thinner by rolling. Since the Cu layer for bonding that constitutes the Cu—Mo layer is a very thin intermediate Cu layer, its heat transfer resistance is negligibly small and has almost no effect on the thermal properties of the heat sink. In other words, there is almost no difference in the thermal properties between a heat sink with a Cu layer for bonding in the Cu—Mo layer and a heat sink without a Cu layer for bonding. The thin Cu sheet is preferably of a thickness such that the thickness of the Cu layer for bonding in the Cu—Mo layer of the heat sink is 75 μm or less (more preferably 25 μm or less).

Except for the conditions described above, the thicknesses of the Cu—Mo layer and the Cu layer, and the layer thickness ratio between the Cu—Mo layer and the Cu layer are not restricted. To ensure thermal properties and to prevent warpage and distortion during rolling and practical use, a structure that is symmetrical in the thickness direction (a structure in which the thicknesses of the Cu layer and Cu—Mo layer are symmetrical in the thickness direction) is preferred, with the Cu layer in the center of the thickness direction as the symmetrical plane.

The heat sink thickness T is not particularly limited. In most cases, the heat sink thickness T is around 1 mm, but it may be thicker than that (e.g., about 2 mm to 3 mm) depending on the application.

The heat sink of the present embodiment is manufactured by diffusion bonding pre-made Cu—Mo composite materials and Cu materials, and then rolling it. Rolling may be performed during the manufacture of the Cu—Mo composite materials. Therefore, the heat sink of the present embodiment is entirely of rolled microstructure. The Mo phase dispersed in the Cu matrix in the Cu—Mo layer is stretched flat, and the aspect ratio (aspect ratio in the rolling direction) of the Mo phase in the thickness section microstructure is typically more than 2. The aspect ratio herein is the major axis/minor axis (length ratio) of the Mo phase in the thickness section microstructure in the rolling direction. For example, the aspect ratio can be specified by observing the thickness section microstructure in the rolling direction after ion milling or the like by an SEM, determining the major axis/minor axis of the Mo phase included in any one observation field, and using the average of these values.

The Mo phase dispersed in the Cu matrix in the Cu—Mo layer has a different flat-stretched form depending on, for example, the Mo content and the rolling type (for example, unidirectional rolling, cross-rolling) of the Cu—Mo layer. For example, in the case where the Mo content in the Cu—Mo layer is relatively low, the flat-stretched Mo phase has a pattern similar to islands separated from each other. On the other hand, in the case where the Mo content is high, the particles of the flat-stretched Mo phase connect to each other, creating a form (rolled microstructure) like a striped or marble pattern in which such Mo phase is mixed with the Cu matrix. Thus, in the latter case, the aspect ratio may be unable to be specifically quantified although it is clearly more than 2.

A semiconductor package in which the heat sink according to the present embodiment is mainly used is repeatedly heated from normal temperature (which may be about −50° C. in cold climates) to about 200° C. during semiconductor operation, as the semiconductor repeats operation and pause. To suppress thermal fatigue, the heat sink needs to have a low coefficient of thermal expansion. It is also important that the coefficient of thermal expansion is low up to about 800° C. in applications involving brazing bonding, and up to about 400° C. in applications involving soldering bonding. Meanwhile, the heat sink needs to have high thermal conductivity especially in the thickness direction, in order to achieve high heat-sink properties.

The heat sink according to the present embodiment has excellent thermal properties including both high thermal conductivity and a low coefficient of thermal expansion. Specifically, the thermal conductivity in the thickness direction (thermal conductivity at room temperature) is preferably 250 W/m·K or more, more preferably 270 W/m·K or more, and further preferably 290 W/m·K or more. The average coefficient of thermal expansion in the in-plane direction from 50° C. to 800° C. is preferably 10.0 ppm/K or less, more preferably 9.0 ppm/K or less, and further preferably 8.5 ppm/K or less.

The heat sink according to the present embodiment may have a coating or plating such as a Ni coating or plating on its surface (on one side or both sides), for corrosion protection or for bonding (brazing bonding or soldering bonding) to another member. This coating or plating is formed with such a thickness that does not significantly affect the thermal properties of the heat sink. The type of the coating or plating is not limited. Examples include a Ni coating or plating, an Au coating or plating, and an Ag coating or plating. These coatings or platings may be used singly or in combination of two or more layers. The coating or plating may be formed on only one side of the heat sink (i.e., on the surface of one of the two Cu layers which are the outermost layers), or on both sides of the heat sink.

Depending on the material property of the heat sink, in order to improve the coatability when a coating or plating such as a Ni coating or plating is applied to the surface of the heat sink, a Cu coating or plating may be applied as a base thereof, but since the outermost layer of the heat sink of the present embodiment is a Cu layer, there is no need to apply such a base coating or plating.

The manufacturing method for the heat sink of the present embodiment may be basically the same as the conventional method (Conventional Technique 2) and may be the same as the manufacturing method described in PTL 2, for example. It is known that the coefficient of thermal expansion of the Cu—Mo composite material is reduced by rolling, and in particular, the coefficient of thermal expansion is effectively reduced by cold rolling. For a Cu—Mo composite having a relatively high Mo content, it may be preferable to perform the whole or part of the rolling by warm rolling because cold rolling may cause edge cracks, etc. depending on the rolling reduction ratio, but in other cases, the rolling in the manufacturing process of the heat sink should be cold rolling, preferably cold rolling with a high rolling reduction ratio.

In one embodiment of the method for manufacturing the heat sink, Cu—Mo composite materials (a) having a thickness section microstructure in which Mo phase is dispersed in a Cu matrix and Cu materials (b) are stacked, and the stacked Cu—Mo composite materials (a) and Cu materials (b) are diffusion bonded to obtain a laminate, and then the laminate is subjected to cold rolling (x) to obtain a heat sink in which Cu—Mo composite layers formed by the Cu—Mo composite materials (a) and Cu layers formed by the Cu materials (b) are stacked. Here, the Cu—Mo composite materials (a) are produced beforehand. The Cu—Mo composite materials (a) may be produced by a method (e.g. any of the below-described methods (i) to (iii)) not involving rolling, or produced by a method (e.g. the below-described method (iv) or (v)) involving rolling (y).

When the Mo content of the Cu—Mo composite materials (a) is relatively high, in order to prevent edge cracks caused by cold rolling, after the laminate is obtained as described above, the laminate may be subjected to warm rolling instead of cold rolling (x) to obtain a heat sink in which the Cu—Mo layers formed by the Cu—Mo composite materials (a) and the Cu layers formed by the Cu materials (b) are stacked. The rolling temperature for warm rolling is preferably, for example, 200° C. or higher. The rolling temperature for warm rolling is preferably, for example, 300° C. or lower.

When the Mo content of the Cu—Mo composite materials (a) is relatively high and the Cu—Mo composite materials are manufactured by a method involving rolling (y), the rolling (y) is preferably performed by warm rolling in order to prevent edge cracks and the like caused by cold rolling. The rolling temperature for warm rolling is preferably, for example, 200° C. or higher. The rolling temperature for warm rolling is preferably, for example, 300° C. or lower.

The thicknesses of the Cu—Mo composite material (a) and the Cu material (b) are appropriately selected according to the thicknesses of the Cu—Mo layer and the Cu layer of the heat sink to be manufactured.

The Cu—Mo composite material (a) and the Cu material (b) may each be composed of a single sheet material. The Cu—Mo composite material (a) may be composed of a plurality of thin Cu—Mo composite materials (a) (unit Cu—Mo composite materials ($a_u$)) stacked together. The Cu material (b) may be composed of a plurality of thin Cu materials (b) (unit Cu materials ($b_u$)) stacked together. This is because the Cu—Mo composite material and Cu material have a possibility of decreasing in thickness in the case where the rolling reduction ratio in the rolling is large.

In addition, in the case where the Cu—Mo composite material (a) is composed of a plurality of unit Cu—Mo composite materials ($a_u$) stacked together as described above, in order to increase the bondability between the unit Cu—Mo composite materials, it is preferable to stack the plurality of unit Cu—Mo composite materials ($a_u$) with a thin Cu sheet (such as Cu foil) being interposed therebetween (that is, a thin Cu sheet is interposed between adjacent unit Cu—Mo composite materials ($a_u$)) and diffusion bond the unit Cu—Mo composite materials with the thin Cu sheet therebetween. The foregoing Cu layer for bonding in the Cu—Mo composite layer of the heat sink is obtained by stretching the thin Cu sheet thinner by rolling. Therefore, the thin Cu sheet is preferably of a thickness such that the thickness of the Cu layer for bonding in the Cu—Mo layer of the heat sink is 75 μm or less (more preferably 25 μm or less).

The method of diffusion bonding the laminate is not limited, but diffusion bonding is preferably performed by spark plasma sintering (SPS) or hot pressing.

As the Cu—Mo composite material (a), any of the below-described materials may be used. As the Cu material (b), a pure Cu sheet (such as pure Cu foil) is typically used.

In the manufacturing process of the heat sink, by performing rolling at a high rolling reduction, the effect of decreasing the coefficient of thermal expansion can be achieved. Therefore, the rolling reduction ratio of the cold rolling (x) is preferably 70% or more. The rolling reduction ratio of the cold rolling (X) is preferably 99% or less. The rolling reduction ratio is more preferably 80% or more. The rolling reduction ratio is more preferably 99% or less. The rolling reduction ratio is further preferably 90% or more. The rolling reduction ratio is further preferably 96% or less.

As described above, in the manufacturing process of the heat sink, in addition to the cold rolling (x), the rolling (y) may be also performed. When the rolling (y) is performed in addition to the cold rolling (x), the total rolling reduction ratio of the cold rolling (x) and the rolling (y) is preferably 70% or more. The total rolling reduction ratio of the cold rolling (x) and the rolling (y) is preferably 99% or less. The total rolling reduction ratio is more preferably 80% or more. The total rolling reduction ratio is more preferably 99% or less. The total rolling reduction ratio is further preferably 90% or more. The total rolling reduction ratio is further preferably 96% or less. The rolling (y) is desirably cold rolling as long as it does not cause ear cracks.

The Cu—Mo composite material (a) is produced beforehand. As the Cu—Mo composite material (a), for example, a Cu—Mo composite material obtainable by any of the following methods (i) to (v) may be used.

(i) A Cu—Mo composite material (a) obtainable by pressing a mixed powder of a Mo powder and a Cu powder to obtain a green compact, and sintering the green compact in a reducing atmosphere or in a vacuum to obtain a sintered body.

(ii) A Cu—Mo composite material (a) obtainable by, after the steps of (i), densifying the sintered body.

(iii) A Cu—Mo composite material (a) obtainable by, after the steps of (i), impregnating the sintered body with Cu molten in a non-oxidizing atmosphere or in a vacuum.

(iv) A Cu—Mo composite material (a) obtainable by, after the steps of (ii), subjecting the densified Cu—Mo composite material to the rolling (y).

(v) A Cu—Mo composite material (a) obtainable by, after the steps of (i), impregnating the sintered body with Cu molten in a non-oxidizing atmosphere or in a vacuum and subjected the Cu—Mo composite material impregnated with Cu to the rolling (y).

The heat sink of the present embodiment as cold rolled or warm rolled or after softening aging heat treatment can be used as a product. A coating or plating such as a Ni coating or plating may be optionally formed on the surface of the heat sink, in order to improve performance such as corrosion resistance and electrolytic corrosion resistance for use as a base of a semiconductor. This coating or plating is formed with such a thickness that does not significantly affect the thermal properties of the heat sink. The type of the coating or plating is not limited. Examples include a Ni coating or plating, an Au coating or plating, and an Ag coating or plating. These coatings or platings may be used singly or in combination of two or more layers. The coating or plating may be formed on only one side of the heat sink (i.e., on the surface of one of the two outermost Cu layers), or on both sides of the heat sink.

The heat sink of the present embodiment is suitable for use in semiconductor packages such as ceramic packages or metal packages included in various semiconductor modules, and exhibits high heat-sink properties and tolerance. In particular, the heat sink of the present embodiment can satisfy the high heat-sink properties required of a heat sink for a semiconductor package with a frame in which a high-output and small-sized semiconductor is directly bonded to the heat sink, and is therefore particularly suitable as a heat sink for such a semiconductor package with a frame. By applying the heat sink of the present embodiment to the semiconductor package with a frame, practical effects such as (i) increasing the durability of the semiconductor and the semiconductor package, (ii) increasing the output of the semiconductor, and (iii) increasing the number of semiconductors mounted can be obtained.

Here, the semiconductor is directly bonded to the heat sink, which means that the semiconductor is bonded (mounted) on the heat sink without the intervention of a heat dispersion sheet (a member with a larger area than the semiconductor) to diffuse heat in the in-plane direction. Thus, for example, a case in which a semiconductor is bonded to the heat sink via a specific thin film or layer formed on the backside of the semiconductor is also included in the case in which the semiconductor is directly bonded to the heat sink.

The high-output and small-sized semiconductor mounted on the semiconductor package with a frame to which the heat sink of the present embodiment is applied is, for example, a semiconductor whose size is about several $mm^2$, such as a GaN semiconductor on a Si substrate or a recently developed GaN semiconductor on a SiC substrate.

For example, examples of the semiconductor package with a frame includes the semiconductor package as described in the EXAMPLES section below on which two or three GaN semiconductors having an area of about 1 mm×5 mm in contact with the heat sink are mounted. Such a semiconductor package with a frame is used for Radio Frequency (RF) power devices applied to mobile base stations, such as those with an average output of 50 W (peak output of 288 W) in the 2.5 to 2.7 GHz band. The use of the millimeter wave band (26 to 111 GHz) is being considered for 5G mobile phones, which are expected to become widespread in the future, and although RF output tends to decrease at higher frequencies, RF power devices for high-output 5G mobile base stations with output power exceeding 100 W are expected. On the other hand, when Si semiconductors are replaced by GaAs semiconductors, GaN semiconductors on Si substrates, and then by GaN semiconductors on SiC substrates, the thermal conductivity of the semiconductors themselves is higher and the losses are lower, so the size of the semiconductors and the number of semiconductors can be reduced for the same frequency band and the same power output, and the semiconductor package becomes more compact and the size of a semiconductor can be reduced. Therefore, a semiconductor with high-output and a small contact area with the heat sink is mounted on the heat sink. Therefore, it can be said that the heat sink of the present embodiment is particularly suitable for such a semiconductor package.

EXAMPLES (1) Manufacturing Conditions for Cu—Mo Composite Material

A mixed powder produced by mixing a Mo powder (FSSS average particle size: 6 μm) and a pure Cu powder (average particle size D50: 5 μm) in a predetermined proportion was put into a mold (50 mm×50 mm) and pressed to obtain a green compact with a thickness corresponding to the rolling reduction in cold rolling in a subsequent step. The green compact was sintered (1000° C., 600 min) in a hydrogen atmosphere to obtain a sintered body. A pure Cu sheet was then placed on the upper surface of the sintered body and heated to 1200° C. in a hydrogen atmosphere (holding time: 180 min) to melt the pure Cu sheet and the sintered body was impregnated with the molten Cu, thus obtaining a Cu—Mo composite material having a predetermined Cu content. After removing Cu remaining on the surface of the Cu—Mo composite material using a milling machine, the Cu—Mo composite material was subjected to unidirectional rolling (y) (cold rolling) at a predetermined rolling reduction to produce a Cu—Mo composite material.

(2) Manufacturing Conditions of Each Test Piece

The Cu—Mo composite materials with the predetermined thickness obtained as described above and pure Cu sheets were alternately stacked in a five to eleven-layer structure so that the Cu materials are outermost layers. The laminate was diffusion bonded using a spark plasma sintering (SPS) device (DR. SINTER SPS-1050 produced by Sumitomo Coal Mining Co., Ltd.), under conditions of 950° C., a holding time of 18 min, and an electrode force of 20 MPa. The laminate was then subjected to rolling (cold rolling) in a direction orthogonal to the rolling direction of the rolling (y) (cold rolling) of the Cu—Mo composite material at the same rolling reduction ratio as in the rolling (y) to manufacture heat sinks (thickness: 1 mm or 3 mm) of Example and Comparative example.

(3) Performance Measurement (3.1) Thermal Properties

For each test piece, the coefficient of thermal expansion in the in-plane direction was measured by a pushrod-type displacement detection method. The difference in elongation between 50° C. and 800° C. was divided by the temperature difference, to calculate the average coefficient of thermal expansion in in-plane direction from 50° C. to 800° C.

The thermal conductivities in the thickness and in-plane directions (both at room temperature) were measured by the laser flash technique described earlier.

Since the "thermal conductivity $\lambda_{Cu-Mo}$ in the thickness direction of the Cu—Mo layer" is determined by the Mo content of the Cu—Mo layer and the rolling reduction ratio of the Cu—Mo layer at the time of manufacturing the heat sink, a rolled sheet composed of only the Cu—Mo composite material corresponding to the Cu—Mo layer was fabricated and the thermal conductivity in the thickness direction was measured, and the measurement value was used as "thermal conductivity $\lambda_{Cu-Mo}$ in the thickness direction of the Cu—Mo layer". In the present example, the rolling reduction ratio of the Cu—Mo layer at the time of manufacturing the heat sink (i.e., the total rolling reduction ratio of the rolling reduction ratio of the Cu—Mo composite material before cladding and the rolling reduction ratio of the clad material at the time of manufacturing the heat sink) was 95%, and as a result of the measurement, the thermal conductivity $\lambda_{Cu-Mo}$ in the thickness direction for the Cu—Mo layer with Mo content of 75 mass % was 175 W/m·K, and the thermal conductivity $\lambda_{Cu-Mo}$ in the thickness direction for the Cu—Mo layer with Mo content of 60 mass % was 194 W/m·K.

(3.2) Cracking Resistance of Ceramic Frame

A ceramic frame (long side length: 19.2 mm, short side length: 9.0 mm, thickness: 0.6 mm, frame width on the long side: 1.5 mm, frame width on the short side: 1.3 mm) was brazed to the upper surface of a heat sink test piece (flat size: 20.6 mm×9.8 mm) and cooled to room temperature. The test piece to which the ceramic frame was bonded was heated to 320° C., which is the temperature assumed for soldering of semiconductors, and then cooled to room temperature to check for cracks in the ceramic frame.

Ten test pieces of each level were tested and checked for cracks in the ceramic frame with a microscope. If the ceramic frame was found to be cracked in any one of the ten test pieces, it was evaluated as "poor", and if no cracks were found in all ten pieces, it was evaluated as "good". In the table, "-" means that the cracking resistance was not evaluated.

(4) Performance Evaluation

The above results are listed in Table 1 to Table 5 along with the manufacturing conditions for the thermal properties of each test piece. In addition, for a part of these examples (a part of five-layer clad materials), the "thermal conductivity in the thickness direction", the "ratio (%) of the thermal conductivity in the thickness direction to the thermal conductivity in the in-plane direction", the "ratio (%) of the measured value to the calculated value of the thermal conductivity in the thickness direction", and the "average coefficient of thermal expansion in the in-plane direction from 50° C. to 800° C." are illustrated in relation to the ratio of the outermost Cu layer thickness $t_1$ to the heat sink thickness T represented by $t_1/T$, and to the ratio of the Cu—Mo layer thickness $t_2$ to the heat sink thickness T represented by $t_2/T$ in FIGS. 4 and 6 to 8. The plots indicated as "Comp. ex. 6" (Comparative example 6), "Comp. ex. 14" (Comparative example 14), and "Comp. ex. 15" (Comparative example 15) in the figures correspond to heat sinks in the Conventional Technique 2 (Patent Document 2), which have a ratio of $t_2/T=0.26$, 0.21, and 0.20, respectively.

As can be understood from the results, the heat sink of the present disclosure has low coefficient of thermal expansion and the following thermal properties: (i) the thermal conductivity in the thickness direction is high, (ii) the value of thermal conductivity in the thickness direction/thermal conductivity in the in-plane direction is high, and heat dissipation balance in the thickness direction and in the in-plane direction is excellent, and (iii) the measured value/calculated value of thermal conductivity in the thickness direction is high, and the desired high thermal conductivity is stably obtained. According to the present disclosure, a heat sink having high heat-sink properties can be provided, so that a semiconductor package having high durability can be provided even if the frame constituting the package is either ceramic or a metal having a low coefficient of thermal expansion. It is also found that when the heat sink of the present disclosure is applied to the semiconductor package with a frame, crack of the ceramic frame can also be appropriately suppressed. Therefore, it is found that the heat sink can satisfy the high heat-sink properties required of a heat sink for use in a semiconductor package with a frame on which high-output and small-sized semiconductor is mounted.

TABLE 1

| No. | Type | Clad structure *1 | Outermost Cu layer thickness/ heat sink thickness (—) *2 | Outermost Cu layer thickness (μm) | Heat sink thickness (mm) | Intermediate Cu layer thickness/ heat sink thickness (—) *2 | Cu—Mo layer thickness/ heat sink thickness (—) *2 | Mo content of Cu—Mo layer (mass %) |
|---|---|---|---|---|---|---|---|---|
| Comparative example 1 | three-layer clad material | Cu—Mo/Cu/ Cu—Mo | 0 | 0 | 1.00 | 0.49 | 0.26 | 75 |
| Comparative example 2 | five-layer clad material | Cu/Cu—Mo/Cu/ Cu—Mo/Cu | 0.01 | 10 | 1.00 | 0.46 | 0.26 | 75 |
| Comparative example 3 | five-layer clad material | Cu/Cu—Mo/Cu/ Cu—Mo/Cu | 0.02 | 20 | 1.00 | 0.44 | 0.26 | 75 |
| Comparative example 4 | five-layer clad material | Cu/Cu—Mo/Cu/ Cu—Mo/Cu | 0.04 | 40 | 1.00 | 0.41 | 0.26 | 75 |
| Comparative example 5 | five-layer clad material | Cu/Cu—Mo/Cu/ Cu—Mo/Cu | 0.06 | 60 | 1.00 | 0.36 | 0.26 | 75 |
| Comparative example 6 | five-layer clad material | Cu/Cu—Mo/Cu/ Cu—Mo/Cu | 0.10 | 100 | 1.00 | 0.28 | 0.26 | 75 |
| Comparative example 7 | five-layer clad material | Cu/Cu—Mo/Cu/ Cu—Mo/Cu | 0.167 | 167 | 1.00 | 0.17 | 0.25 | 75 |
| Comparative example 8 | three-layer clad material | Cu/Cu—Mo/Cu | 0.25 | 250 | 1.00 | 0 | 0.49 | 75 |
| Comparative example 9 | three-layer clad material | Cu—Mo/Cu/ Cu—Mo | 0 | 0 | 1.00 | 0.60 | 0.22 | 75 |
| Comparative example 10 | five-layer clad material | Cu/Cu—Mo/Cu/ Cu—Mo/Cu | 0.01 | 10 | 1.00 | 0.58 | 0.20 | 75 |
| Comparative example 11 | five-layer clad material | Cu/Cu—Mo/Cu/ Cu—Mo/Cu | 0.02 | 20 | 1.00 | 0.55 | 0.21 | 75 |
| Comparative example 12 | five-layer clad material | Cu/Cu—Mo/Cu/ Cu—Mo/Cu | 0.04 | 40 | 1.00 | 0.52 | 0.20 | 75 |
| Comparative example 13 | five-layer clad material | Cu/Cu—Mo/Cu/ Cu—Mo/Cu | 0.06 | 60 | 1.00 | 0.47 | 0.21 | 75 |
| Comparative example 14 | five-layer clad material | Cu/Cu—Mo/Cu/ Cu—Mo/Cu | 0.10 | 100 | 1.00 | 0.39 | 0.21 | 75 |
| Comparative example 15 | five-layer clad material | Cu/Cu—Mo/Cu/ Cu—Mo/Cu | 0.20 | 200 | 1.00 | 0.20 | 0.20 | 75 |
| Comparative example 16 | three-layer clad material | Cu/Cu—Mo/Cu | 0.30 | 300 | 1.00 | 0 | 0.41 | 75 |

| No. | Average coefficient of thermal expansion in in-plane direction from 50° C. to 800° C. ($\times 10^{-6}$/K) *3 | Thermal conductivity in thickness direction (W/m·K) | Thermal conductivity in in-plane direction (W/m·K) | Ratio of thermal conductivity in thickness direction to thermal conductivity in in-plane direction *5 | Calculated thermal conductivity in thickness direction (W/m·K) | Measured value/ calculated value of thermal conductivity in thickness direction *4 | Crack resistance of ceramic frame |
|---|---|---|---|---|---|---|---|
| Comparative example 1 | 7.47 | 275 | 294 | 94% | 287 | 95.7% | — |
| Comparative example 2 | 7.63 | 281 | 298 | 94% | 285 | 98.6% | poor |
| Comparative example 3 | 7.76 | 272 | 298 | 91% | 285 | 95.5% | poor |
| Comparative example 4 | 7.44 | 259 | 301 | 86% | 287 | 90.1% | good |
| Comparative example 5 | 7.40 | 251 | 298 | 84% | 285 | 88.1% | good |
| Comparative example 6 | 7.31 | 233 | 302 | 77% | 287 | 81.1% | — |

TABLE 1-continued

| | | | | | | | |
|---|---|---|---|---|---|---|---|
| Comparative example 7 | 7.25 | 224 | 311 | 72% | 290 | 77.2% | — |
| Comparative example 8 | 7.64 | 216 | 313 | 69% | 293 | 73.8% | — |
| Comparative example 9 | 7.91 | 310 | 312 | 99% | 303 | 102.4% | — |
| Comparative example 10 | 8.02 | 311 | 323 | 96% | 313 | 99.4% | — |
| Comparative example 11 | 8.03 | 306 | 321 | 95% | 310 | 98.6% | poor |
| Comparative example 12 | 7.94 | 290 | 325 | 89% | 313 | 92.7% | good |
| Comparative example 13 | 7.86 | 281 | 321 | 88% | 310 | 90.5% | — |
| Comparative example 14 | 7.74 | 266 | 322 | 83% | 310 | 85.7% | — |
| Comparative example 15 | 7.66 | 245 | 329 | 74% | 313 | 78.3% | — |
| Comparative example 16 | 8.00 | 236 | 328 | 72% | 310 | 76.0% | — |

*1 Cu: Cu layer, Cu—Mo: Cu—Mo composite layer
*2 Outermost Cu layer thickness: thickness of each Cu layer as outermost layer
Intermediate Cu layer thickness: thickness of Cu layer as intermediate layer (for seven to eleven-layer clad material, thickness of each Cu layer)
Cu—Mo layer thickness: thickness of each Cu—Mo composite layer
*3 Average coefficient of thermal expansion in in-plane direction from 50° C. to 800° C.
*4 (Thermal conductivity in thickness direction/calculated thermal conductivity in thickness direction) × 100
*5 (Thermal conductivity in thickness direction/thermal conductivity in in-plane direction) × 100

TABLE 2

| | | Structure of heat sink | | | | | | |
|---|---|---|---|---|---|---|---|---|
| No. | Type | Clad structure *1 | Outermost Cu layer thickness/ heat sink thickness (—) *2 | Outermost Cu layer thickness (µm) | Heat sink thickness (mm) | Intermediate Cu layer thickness/ heat sink thickness (—) *2 | Cu—Mo layer thickness/ heat sink thickness (—) *2 | Mo content of Cu—Mo layer (mass %) |
| Comparative example 17 | three-layer clad material | Cu—Mo/Cu/ Cu—Mo | 0 | 0 | 1.00 | 0.64 | 0.18 | 75 |
| Comparative example 18 | five-layer clad material | Cu/Cu—Mo/Cu/ Cu—Mo/Cu | 0.03 | 30 | 1.05 | 0.59 | 0.17 | 75 |
| Example 1 | five-layer clad material | Cu/Cu—Mo/Cu/ Cu—Mo/Cu | 0.06 | 60 | 1.03 | 0.53 | 0.18 | 75 |
| Example 2 | five-layer clad material | Cu/Cu—Mo/Cu/ Cu—Mo/Cu | 0.10 | 100 | 1.00 | 0.44 | 0.18 | 75 |
| Example 3 | five-layer clad material | Cu/Cu—Mo/Cu/ Cu—Mo/Cu | 0.12 | 120 | 1.00 | 0.42 | 0.17 | 75 |
| Example 4 | five-layer clad material | Cu/Cu—Mo/Cu/ Cu—Mo/Cu | 0.15 | 150 | 1.00 | 0.33 | 0.18 | 75 |
| Example 5 | five-layer clad material | Cu/Cu—Mo/Cu/ Cu—Mo/Cu | 0.18 | 180 | 1.00 | 0.28 | 0.18 | 75 |
| Example 6 | five-layer clad material | Cu/Cu—Mo/Cu/ Cu—Mo/Cu | 0.20 | 200 | 1.00 | 0.24 | 0.18 | 75 |
| Example 7 | five-layer clad material | Cu/Cu—Mo/Cu/ Cu—Mo/Cu | 0.25 | 250 | 1.00 | 0.14 | 0.18 | 75 |
| Comparative example 19 | three-layer clad material | Cu/Cu—Mo/Cu | 0.33 | 330 | 1.00 | 0 | 0.36 | 75 |
| Comparative example 20 | three-layer clad material | Cu—Mo/Cu/ Cu—Mo | 0 | 0 | 1.00 | 0.70 | 0.15 | 75 |
| Comparative example 21 | five-layer clad material | Cu/Cu—Mo/Cu/ Cu—Mo/Cu | 0.03 | 30 | 1.02 | 0.65 | 0.15 | 75 |
| Example 8 | five-layer clad material | Cu/Cu—Mo/Cu/ Cu—Mo/Cu | 0.06 | 60 | 1.00 | 0.58 | 0.15 | 75 |
| Example 9 | five-layer clad material | Cu/Cu—Mo/Cu/ Cu—Mo/Cu | 0.11 | 110 | 1.04 | 0.49 | 0.15 | 75 |
| Example 10 | five-layer clad material | Cu/Cu—Mo/Cu/ Cu—Mo/Cu | 0.16 | 160 | 1.02 | 0.39 | 0.15 | 75 |
| Comparative example 22 | three-layer clad material | Cu/Cu—Mo/Cu | 0.36 | 360 | 1.03 | 0 | 0.29 | 75 |
| Example 11 | five-layer clad material | Cu/Cu—Mo/Cu/ Cu—Mo/Cu | 0.12 | 120 | 1.00 | 0.45 | 0.16 | 75 |

TABLE 2-continued

| | | | | | | | | |
|---|---|---|---|---|---|---|---|---|
| Example 12 | five-layer clad material | Cu/Cu—Mo/Cu/ Cu—Mo/Cu | 0.18 | 180 | 1.00 | 0.34 | 0.15 | 75 |
| Example 13 | five-layer clad material | Cu/Cu—Mo/Cu/ Cu—Mo/Cu | 0.20 | 200 | 1.00 | 0.30 | 0.15 | 75 |
| Example 14 | five-layer clad material | Cu/Cu—Mo/Cu/ Cu—Mo/Cu | 0.25 | 250 | 1.00 | 0.20 | 0.15 | 75 |

| | Thermal properties | | | | | | |
|---|---|---|---|---|---|---|---|
| No. | Average coefficient of thermal expansion in in-plane direction from 50° C. to 800° C. ($\times 10^{-6}$/K) *3 | Thermal conductivity in thickness direction (W/m · K) | Thermal conductivity in in-plane direction (W/m · K) | Ratio of thermal conductivity in thickness direction to thermal conductivity in in-plane direction *5 | Calculated thermal conductivity in thickness direction (W/m · K) | Measured value/ calculated value of thermal conductivity in thickness direction *4 | Crack resistance of ceramic frame |
| Comparative example 17 | 8.10 | 323 | 332 | 97% | 323 | 100.0% | poor |
| Comparative example 18 | 7.95 | 313 | 334 | 94% | 326 | 96.1% | poor |
| Example 1 | 7.90 | 298 | 331 | 90% | 321 | 92.9% | good |
| Example 2 | 7.76 | 286 | 334 | 86% | 323 | 88.5% | good |
| Example 3 | 7.83 | 280 | 337 | 83% | 326 | 86.0% | — |
| Example 4 | 7.83 | 269 | 333 | 81% | 321 | 84.0% | — |
| Example 5 | 7.83 | 263 | 337 | 78% | 323 | 81.5% | — |
| Example 6 | 7.83 | 259 | 339 | 76% | 323 | 80.0% | good |
| Example 7 | 7.90 | 254 | 339 | 75% | 323 | 78.5% | — |
| Comparative example 19 | 8.18 | 247 | 340 | 73% | 323 | 76.5% | — |
| Comparative example 20 | 8.22 | 336 | 344 | 98% | 336 | 100.0% | — |
| Comparative example 21 | 8.10 | 329 | 344 | 96% | 336 | 97.9% | poor |
| Example 8 | 8.10 | 309 | 345 | 90% | 336 | 92.0% | good |
| Example 9 | 8.10 | 294 | 345 | 85% | 336 | 87.5% | — |
| Example 10 | 8.15 | 281 | 346 | 81% | 336 | 83.6% | good |
| Comparative example 22 | 8.30 | 260 | 354 | 73% | 339 | 76.8% | — |
| Example 11 | 8.07 | 290 | 344 | 84% | 333 | 87.0% | — |
| Example 12 | 8.03 | 277 | 347 | 80% | 336 | 82.5% | — |
| Example 13 | 8.03 | 270 | 350 | 77% | 336 | 80.5% | — |
| Example 14 | 8.03 | 265 | 350 | 76% | 336 | 79.0% | — |

*1 Cu: Cu layer, Cu—Mo: Cu—Mo composite layer
*2 Outermost Cu layer thickness: thickness of each Cu layer as outermost layer
Intermediate Cu layer thickness: thickness of Cu layer as intermediate layer (for seven to eleven-layer clad material, thickness of each Cu layer)
Cu—Mo layer thickness: thickness of each Cu—Mo composite layer
*3 Average coefficient of thermal expansion in in-plane direction from 50° C. to 800° C.
*4 (Thermal conductivity in thickness direction/calculated thermal conductivity in thickness direction) × 100
*5 (Thermal conductivity in thickness direction/thermal conductivity in in-plane direction) × 100

TABLE 3

| | Structure of heat sink | | | | | | |
|---|---|---|---|---|---|---|---|
| No. | Type | Clad structure *1 | Outermost Cu layer thickness/ heat sink thickness (—) *2 | Outermost Cu layer thickness (μm) | Heat sink thickness (mm) | Intermediate Cu layer thickness/ heat sink thickness (—) *2 | Cu—Mo layer thickness/ heat sink thickness (—) *2 | Mo content of Cu—Mo layer (mass %) |
| Comparative example 23 | three-layer clad material | Cu—Mo/Cu/ Cu—Mo | 0 | 0 | 1.00 | 0.76 | 0.12 | 75 |
| Comparative example 24 | five-layer clad material | Cu/Cu—Mo/Cu/ Cu—Mo/Cu | 0.03 | 30 | 1.00 | 0.70 | 0.12 | 75 |
| Example 15 | five-layer clad material | Cu/Cu—Mo/Cu/ Cu—Mo/Cu | 0.06 | 60 | 1.00 | 0.64 | 0.12 | 75 |
| Example 16 | five-layer clad material | Cu/Cu—Mo/Cu/ Cu—Mo/Cu | 0.12 | 120 | 1.04 | 0.54 | 0.13 | 75 |

TABLE 3-continued

| No. | Type | Structure *1 | Outermost Cu layer thickness *2 | (col) | (col) | Intermediate Cu layer thickness | Cu—Mo layer thickness | (col) |
|---|---|---|---|---|---|---|---|---|
| Example 17 | five-layer clad material | Cu/Cu—Mo/Cu/Cu—Mo/Cu | 0.12 | 120 | 1.00 | 0.52 | 0.12 | 75 |
| Example 18 | five-layer clad material | Cu/Cu—Mo/Cu/Cu—Mo/Cu | 0.15 | 150 | 1.00 | 0.46 | 0.12 | 75 |
| Example 19 | five-layer clad material | Cu/Cu—Mo/Cu/Cu—Mo/Cu | 0.18 | 180 | 1.00 | 0.40 | 0.12 | 75 |
| Example 20 | five-layer clad material | Cu/Cu—Mo/Cu/Cu—Mo/Cu | 0.20 | 200 | 1.00 | 0.36 | 0.12 | 75 |
| Example 21 | five-layer clad material | Cu/Cu—Mo/Cu/Cu—Mo/Cu | 0.25 | 250 | 1.00 | 0.26 | 0.12 | 75 |
| Comparative example 25 | three-layer clad material | Cu/Cu—Mo/Cu | 0.38 | 380 | 1.00 | 0 | 0.24 | 75 |
| Comparative example 26 | three-layer clad material | Cu—Mo/Cu/Cu—Mo | 0 | 0 | 1.00 | 0.81 | 0.09 | 75 |
| Comparative example 27 | five-layer clad material | Cu/Cu—Mo/Cu/Cu—Mo/Cu | 0.03 | 30 | 1.00 | 0.75 | 0.09 | 75 |
| Example 22 | five-layer clad material | Cu/Cu—Mo/Cu/Cu—Mo/Cu | 0.06 | 60 | 1.00 | 0.69 | 0.09 | 75 |
| Example 23 | five-layer clad material | Cu/Cu—Mo/Cu/Cu—Mo/Cu | 0.10 | 100 | 1.00 | 0.61 | 0.09 | 75 |
| Example 24 | five-layer clad material | Cu/Cu—Mo/Cu/Cu—Mo/Cu | 0.12 | 120 | 1.00 | 0.57 | 0.09 | 75 |
| Example 25 | five-layer clad material | Cu/Cu—Mo/Cu/Cu—Mo/Cu | 0.15 | 150 | 1.00 | 0.51 | 0.09 | 75 |
| Example 26 | five-layer clad material | Cu/Cu—Mo/Cu/Cu—Mo/Cu | 0.18 | 180 | 1.00 | 0.44 | 0.10 | 75 |
| Example 27 | five-layer clad material | Cu/Cu—Mo/Cu/Cu—Mo/Cu | 0.20 | 200 | 1.00 | 0.41 | 0.09 | 75 |
| Example 28 | five-layer clad material | Cu/Cu—Mo/Cu/Cu—Mo/Cu | 0.25 | 250 | 1.00 | 0.31 | 0.09 | 75 |
| Comparative example 28 | three-layer clad material | Cu/Cu—Mo/Cu | 0.41 | 410 | 1.00 | 0 | 0.19 | 75 |

| No. | Thermal properties | | | | | | |
|---|---|---|---|---|---|---|---|
| | Average coefficient of thermal expansion in in-plane direction from 50° C. to 800° C. ($\times 10^{-6}$/K) *3 | Thermal conductivity in thickness direction (W/m·K) | Thermal conductivity in in-plane direction (W/m·K) | Ratio of thermal conductivity in thickness direction to thermal conductivity in in-plane direction *5 | Calculated thermal conductivity in thickness direction (W/m·K) | Measured value/calculated value of thermal conductivity in thickness direction *4 | Crack resistance of ceramic frame |
| Comparative example 23 | 8.47 | 349 | 355 | 98% | 349 | 100.0% | — |
| Comparative example 24 | 8.35 | 345 | 355 | 97% | 349 | 98.8% | poor |
| Example 15 | 8.35 | 322 | 356 | 91% | 349 | 92.4% | good |
| Example 16 | 8.35 | 309 | 354 | 87% | 346 | 88.6% | — |
| Example 17 | 8.30 | 307 | 357 | 86% | 349 | 88.0% | good |
| Example 18 | 8.27 | 298 | 358 | 83% | 349 | 85.5% | — |
| Example 19 | 8.17 | 293 | 360 | 81% | 349 | 84.0% | — |
| Example 20 | 8.17 | 286 | 362 | 79% | 349 | 82.0% | — |
| Example 21 | 8.30 | 283 | 363 | 78% | 349 | 81.0% | — |
| Comparative example 25 | 8.55 | 272 | 364 | 75% | 349 | 78.0% | — |
| Comparative example 26 | 8.91 | 362 | 366 | 99% | 362 | 100.0% | — |
| Comparative example 27 | 8.82 | 361 | 366 | 99% | 362 | 99.8% | poor |
| Example 22 | 8.78 | 336 | 367 | 91% | 362 | 92.9% | good |
| Example 23 | 8.51 | 333 | 368 | 90% | 362 | 92.0% | — |
| Example 24 | 8.47 | 325 | 369 | 88% | 362 | 90.0% | — |
| Example 25 | 8.44 | 315 | 370 | 85% | 362 | 87.0% | good |
| Example 26 | 8.37 | 307 | 369 | 83% | 359 | 85.5% | — |
| Example 27 | 8.37 | 304 | 374 | 81% | 362 | 84.0% | — |
| Example 28 | 8.42 | 296 | 374 | 79% | 362 | 82.0% | — |
| Comparative example 28 | 8.74 | 286 | 375 | 76% | 362 | 79.0% | — |

*1 Cu: Cu layer, Cu—Mo: Cu—Mo composite layer
*2 Outermost Cu layer thickness: thickness of each Cu layer as outermost layer
Intermediate Cu layer thickness: thickness of Cu layer as intermediate layer (for seven to eleven-layer clad material, thickness of each Cu layer)
Cu—Mo layer thickness: thickness of each Cu—Mo composite layer
*3 Average coefficient of thermal expansion in in-plane direction from 50° C. to 800° C.
*4 (Thermal conductivity in thickness direction/calculated thermal conductivity in thickness direction) × 100
*5 (Thermal conductivity in thickness direction/thermal conductivity in in-plane direction) × 100

TABLE 4

| No. | Type | Clad structure *1 | Outermost Cu layer thickness/ heat sink thickness (—) *2 | Outermost Cu layer thickness (μm) | Heat sink thickness (mm) | Intermediate Cu layer thickness/ heat sink thickness (—) *2 | Cu—Mo layer thickness/ heat sink thickness (—) *2 | Mo content of Cu—Mo layer (mass %) |
|---|---|---|---|---|---|---|---|---|
| Comparative example 29 | five-layer clad material | Cu/Cu—Mo/Cu/ Cu—Mo/Cu | 0.06 | 60 | 1.00 | 0.23 | 0.33 | 60 |
| Comparative example 30 | five-layer clad material | Cu/Cu—Mo/Cu/ Cu—Mo/Cu | 0.10 | 100 | 1.00 | 0.15 | 0.33 | 60 |
| Comparative example 31 | five-layer clad material | Cu/Cu—Mo/Cu/ Cu—Mo/Cu | 0.12 | 120 | 1.00 | 0.12 | 0.32 | 60 |
| Comparative example 32 | five-layer clad material | Cu/Cu—Mo/Cu/ Cu—Mo/Cu | 0.15 | 150 | 1.00 | 0.06 | 0.32 | 60 |
| Comparative example 33 | five-layer clad material | Cu/Cu—Mo/Cu/ Cu—Mo/Cu | 0.06 | 60 | 1.00 | 0.37 | 0.26 | 60 |
| Comparative example 34 | five-layer clad material | Cu/Cu—Mo/Cu/ Cu—Mo/Cu | 0.10 | 100 | 1.00 | 0.30 | 0.25 | 60 |
| Comparative example 35 | five-layer clad material | Cu/Cu—Mo/Cu/ Cu—Mo/Cu | 0.12 | 120 | 1.00 | 0.26 | 0.25 | 60 |
| Comparative example 36 | five-layer clad material | Cu/Cu—Mo/Cu/ Cu—Mo/Cu | 0.15 | 150 | 1.00 | 0.19 | 0.26 | 60 |
| Comparative example 37 | five-layer clad material | Cu/Cu—Mo/Cu/ Cu—Mo/Cu | 0.20 | 200 | 1.00 | 0.09 | 0.26 | 60 |
| Example 29 | five-layer clad material | Cu/Cu—Mo/Cu/ Cu—Mo/Cu | 0.10 | 100 | 1.00 | 0.56 | 0.12 | 60 |
| Example 30 | five-layer clad material | Cu/Cu—Mo/Cu/ Cu—Mo/Cu | 0.12 | 120 | 1.00 | 0.52 | 0.12 | 60 |
| Example 31 | five-layer clad material | Cu/Cu—Mo/Cu/ Cu—Mo/Cu | 0.15 | 150 | 1.00 | 0.46 | 0.12 | 60 |
| Example 32 | five-layer clad material | Cu/Cu—Mo/Cu/ Cu—Mo/Cu | 0.20 | 200 | 1.00 | 0.36 | 0.12 | 60 |
| Example 33 | five-layer clad material | Cu/Cu—Mo/Cu/ Cu—Mo/Cu | 0.10 | 100 | 1.00 | 0.45 | 0.17 | 60 |
| Example 34 | five-layer clad material | Cu/Cu—Mo/Cu/ Cu—Mo/Cu | 0.12 | 120 | 1.00 | 0.41 | 0.17 | 60 |
| Example 35 | five-layer clad material | Cu/Cu—Mo/Cu/ Cu—Mo/Cu | 0.15 | 150 | 1.00 | 0.35 | 0.17 | 60 |
| Example 36 | five-layer clad material | Cu/Cu—Mo/Cu/ Cu—Mo/Cu | 0.20 | 200 | 1.00 | 0.25 | 0.17 | 60 |
| Example 37 | five-layer clad material | Cu/Cu—Mo/Cu/ Cu—Mo/Cu | 0.10 | 100 | 1.00 | 0.43 | 0.18 | 60 |
| Example 38 | five-layer clad material | Cu/Cu—Mo/Cu/ Cu—Mo/Cu | 0.12 | 120 | 1.00 | 0.39 | 0.18 | 60 |
| Example 39 | five-layer clad material | Cu/Cu—Mo/Cu/ Cu—Mo/Cu | 0.15 | 150 | 1.00 | 0.33 | 0.18 | 60 |
| Example 40 | five-layer clad material | Cu/Cu—Mo/Cu/ Cu—Mo/Cu | 0.20 | 200 | 1.00 | 0.23 | 0.18 | 60 |

| No. | Average coefficient of thermal expansion in in-plane direction from 50° C. to 800° C. (×10⁻⁶/K) *3 | Thermal conductivity in thickness direction (W/m·K) | Thermal conductivity in in-plane direction (W/m·K) | Ratio of thermal conductivity in thickness direction to thermal conductivity in in-plane direction *5 | Calculated thermal conductivity in thickness direction (W/m·K) | Measured value/ calculated value of thermal conductivity in thickness direction *4 | Crack resistance of ceramic frame |
|---|---|---|---|---|---|---|---|
| Comparative example 29 | 8.58 | 252 | 295 | 85% | 275 | 91.5% | — |
| Comparative example 30 | 8.54 | 234 | 295 | 79% | 275 | 85.0% | — |
| Comparative example 31 | 8.50 | 228 | 298 | 76% | 278 | 82.0% | — |
| Comparative example 32 | 8.62 | 226 | 299 | 76% | 278 | 81.5% | — |
| Comparative example 33 | 8.72 | 279 | 319 | 88% | 297 | 94.0% | — |
| Comparative example 34 | 8.68 | 267 | 322 | 83% | 300 | 89.0% | — |
| Comparative example 35 | 8.70 | 261 | 322 | 81% | 300 | 87.0% | — |

TABLE 4-continued

|  |  |  |  |  |  |  |  |
|---|---|---|---|---|---|---|---|
| Comparative example 36 | 8.72 | 252 | 321 | 79% | 297 | 85.0% | — |
| Comparative example 37 | 8.76 | 246 | 324 | 76% | 297 | 83.0% | — |
| Example 29 | 9.99 | 353 | 375 | 94% | 355 | 99.4% | good |
| Example 30 | 9.93 | 346 | 375 | 92% | 355 | 97.3% | — |
| Example 31 | 9.78 | 334 | 375 | 89% | 355 | 94.1% | — |
| Example 32 | 9.85 | 323 | 375 | 86% | 355 | 90.9% | good |
| Example 33 | 9.03 | 309 | 351 | 88% | 332 | 93.0% | good |
| Example 34 | 9.01 | 302 | 352 | 86% | 332 | 91.0% | — |
| Example 35 | 8.99 | 292 | 353 | 83% | 332 | 88.0% | — |
| Example 36 | 9.04 | 282 | 356 | 79% | 332 | 85.0% | good |
| Example 37 | 9.03 | 303 | 347 | 87% | 326 | 93.0% | good |
| Example 38 | 9.01 | 297 | 347 | 85% | 326 | 91.0% | — |
| Example 39 | 8.99 | 287 | 348 | 82% | 326 | 88.0% | — |
| Example 40 | 9.04 | 277 | 352 | 79% | 326 | 85.0% | good |

*1 Cu: Cu layer, Cu—Mo: Cu—Mo composite layer
*2 Outermost Cu layer thickness: thickness of each Cu layer as outermost layer
Intermediate Cu layer thickness: thickness of Cu layer as intermediate layer (for seven to eleven-layer clad material, thickness of each Cu layer)
Cu—Mo layer thickness: thickness of each Cu—Mo composite layer
*3 Average coefficient of thermal expansion in in-plane direction from 50° C. to 800° C.
*4 (Thermal conductivity in thickness direction/calculated thermal conductivity in thickness direction) × 100
*5 (Thermal conductivity in thickness direction/thermal conductivity in in-plane direction) × 100

TABLE 5

| | | | Structure of heat sink | | | | | |
|---|---|---|---|---|---|---|---|---|
| No. | Type | Clad structure *1 | Outermost Cu layer thickness/ heat sink thickness (—) *2 | Outermost Cu layer thickness (μm) | Heat sink thickness (mm) | Intermediate Cu layer thickness/ heat sink thickness (—) *2 | Cu—Mo layer thickness/ heat sink thickness (—) *2 | Mo content of Cu—Mo layer (mass %) |
| Comparative example 38 | seven-layer clad material | Cu/Cu—Mo/Cu/ Cu—Mo/Cu/ Cu—Mo/Cu | 0.125 | 125 | 1.00 | 0.13 | 0.17 | 75 |
| Comparative example 39 | seven-layer clad material | Cu/Cu—Mo/Cu/ Cu—Mo/Cu/ Cu—Mo/Cu | 0.150 | 150 | 1.00 | 0.15 | 0.13 | 75 |
| Example 41 | seven-layer clad material | Cu/Cu—Mo/Cu/ Cu—Mo/Cu/ Cu—Mo/Cu | 0.161 | 161 | 1.00 | 0.16 | 0.12 | 75 |
| Example 42 | seven-layer clad material | Cu/Cu—Mo/Cu/ Cu—Mo/Cu/ Cu—Mo/Cu | 0.125 | 125 | 1.00 | 0.20 | 0.12 | 75 |
| Example 43 | seven-layer clad material | Cu/Cu—Mo/Cu/ Cu—Mo/Cu/ Cu—Mo/Cu | 0.150 | 150 | 1.00 | 0.20 | 0.10 | 75 |
| Example 44 | seven-layer clad material | Cu/Cu—Mo/Cu/ Cu—Mo/Cu/ Cu—Mo/Cu | 0.175 | 175 | 1.00 | 0.18 | 0.10 | 75 |
| Example 45 | seven-layer clad material | Cu/Cu—Mo/Cu/ Cu—Mo/Cu/ Cu—Mo/Cu | 0.189 | 189 | 1.04 | 0.19 | 0.08 | 75 |
| Example 46 | seven-layer clad material | Cu/Cu—Mo/Cu/ Cu—Mo/Cu/ Cu—Mo/Cu | 0.203 | 203 | 1.00 | 0.20 | 0.06 | 75 |
| Example 47 | nine-layer clad material | Cu/Cu—Mo/Cu/ Cu—Mo/Cu/ Cu—Mo/Cu/ Cu—Mo/Cu | 0.021 | 63 | 3.00 | 0.20 | 0.09 | 75 |
| Example 48 | nine-layer clad material | Cu/Cu—Mo/Cu/ Cu—Mo/Cu/ Cu—Mo/Cu/ Cu—Mo/Cu | 0.125 | 375 | 3.00 | 0.13 | 0.09 | 75 |
| Example 49 | eleven-layer clad material | Cu/Cu—Mo/Cu/ Cu—Mo/Cu/ Cu—Mo/Cu/ Cu—Mo/Cu/ Cu—Mo/Cu | 0.125 | 375 | 3.00 | 0.10 | 0.07 | 75 |

TABLE 5-continued

| No. | Average coefficient of thermal expansion in in-plane direction from 50° C. to 800° C. (×10⁻⁶/K) *3 | Thermal conductivity in thickness direction (W/m · K) | Thermal conductivity in in-plane direction (W/m · K) | Ratio of thermal conductivity in thickness direction to thermal conductivity in in-plane direction *5 | Calculated thermal conductivity in thickness direction (W/m · K) | Measured value/ calculated value of thermal conductivity in thickness direction *4 | Crack resistance of ceramic frame |
|---|---|---|---|---|---|---|---|
| Comparative example 38 | 7.22 | 229 | 309 | 74% | 290 | 79.0% | — |
| Comparative example 39 | 7.40 | 248 | 329 | 75% | 313 | 79.2% | — |
| Example 41 | 7.70 | 260 | 339 | 77% | 323 | 80.5% | — |
| Example 42 | 7.70 | 272 | 339 | 80% | 323 | 84.0% | good |
| Example 43 | 7.85 | 281 | 350 | 80% | 336 | 83.5% | — |
| Example 44 | 7.90 | 272 | 350 | 78% | 336 | 81.0% | good |
| Example 45 | 8.03 | 286 | 362 | 79% | 349 | 82.0% | — |
| Example 46 | 8.24 | 296 | 374 | 79% | 362 | 82.0% | good |
| Example 47 | 7.55 | 314 | 335 | 93% | 323 | 97.0% | good |
| Example 48 | 7.60 | 270 | 335 | 80% | 323 | 83.5% | — |
| Example 49 | 7.53 | 268 | 335 | 80% | 323 | 83.0% | good |

*1 Cu: Cu layer, Cu—Mo: Cu—Mo composite layer
*2 Outermost Cu layer thickness: thickness of each Cu layer as outermost layer
Intermediate Cu layer thickness: thickness of Cu layer as intermediate layer (for seven to eleven-layer clad material, thickness of each Cu layer)
Cu—Mo layer thickness: thickness of each Cu—Mo composite layer
*3 Average coefficient of thermal expansion in in-plane direction from 50° C. to 800° C.
*4 (Thermal conductivity in thickness direction/calculated thermal conductivity in thickness direction) × 100
*5 (Thermal conductivity in thickness direction/thermal conductivity in in-plane direction) × 100

REFERENCE SIGNS LIST 1a, 1b Cu layer
2 Cu—Mo composite layer (Cu—Mo layer)
3 Heat sink
4 Ceramic frame
5 Semiconductor
6 Electrode
7 Capacitor
8 Connection wire
9 Lid
30 Heat sink
40 Metal frame
50 Semiconductor
60 Electrode
70 Electrode
80 Connection wire
90 Lid
100 Insulator
s Semiconductor

The invention claimed is:

1. A heat sink comprising three or more Cu layers and two or more Cu—Mo composite layers alternately stacked in a thickness direction so that the two of the Cu layers are outermost layers on both sides thereof, wherein
the Cu—Mo composite layers each have a thickness section microstructure in which a flat Mo phase is dispersed in a Cu matrix,
the Cu layers as the outermost layers on both sides each have a thickness $t_1$ of 40 μm or more,
the heat sink satisfies $0.06 \leq t_1/T \leq 0.27$, where T denotes a heat sink thickness, and $t_2/T \leq 0.36/[(\text{total number of layers}-1)/2]$, where $t_2$ denotes a thickness of each of the Cu—Mo composite layers and the total number of layers is a sum of the number of the Cu layers and the number of the Cu—Mo composite layers.

2. The heat sink according to claim 1, which satisfies $t_2/T \leq 0.30/[(\text{total number of layers}-1)/2]$, where the total number of layers is a sum of the number of the Cu layers and the number of the Cu—Mo composite layers.

3. The heat sink according to claim 1, which satisfies $0.10 \leq t_1/T \leq 0.27$.

4. The heat sink of according to claim 1, which satisfies $0.10 \leq t_1/T \leq 0.20$.

5. The heat sink according to claim 1, the Cu—Mo composite layers each have a Mo content of 50 mass % or more and 80 mass % or less.

6. The heat sink according to claim 1 wherein the Cu—Mo composite layers each have a structure in which a plurality of unit Cu—Mo composite layers are stacked with a Cu layer for bonding having a thickness of 75 μm or less being interposed therebetween.

7. The heat sink according to claim 1, comprising a thermal conductivity in the thickness direction of 250 W/m·K or more, and an average coefficient of thermal expansion in an in-plane direction from 50° C. to 800° C. of 10.0 ppm/K or less.

8. The heat sink according to claim 1, comprising a coating or plating on one or both sides thereof.

9. A semiconductor package comprising the heat sink according to claim 1.

10. The semiconductor package according to claim 9, comprising a structure in which a frame made of ceramic or metal with a low coefficient of thermal expansion is bonded to the heat sink and a semiconductor is bonded to the heat sink inside the frame.

11. A semiconductor module comprising the semiconductor package according to claim 9.

* * * * *